United States Patent
Nomura

(10) Patent No.: US 7,435,016 B2
(45) Date of Patent: Oct. 14, 2008

(54) IMAGING DEVICE CONTAINING FLEXIBLE PRINTED WIRING BOARD

(75) Inventor: Hiroshi Nomura, Saitama (JP)

(73) Assignee: Hoya Corporation, Tokyo (JP)

( * ) Notice: Subject to any disclaimer, the term of this patent is extended or adjusted under 35 U.S.C. 154(b) by 512 days.

(21) Appl. No.: 11/289,560

(22) Filed: Nov. 30, 2005

(65) Prior Publication Data

US 2006/0115261 A1 Jun. 1, 2006

(30) Foreign Application Priority Data

Dec. 1, 2004 (JP) ............................. 2004-349190

(51) Int. Cl.
G03B 17/04 (2006.01)
(52) U.S. Cl. ...................................... 396/348; 396/542
(58) Field of Classification Search ................... 396/73, 396/348, 350, 270, 542
See application file for complete search history.

(56) References Cited

U.S. PATENT DOCUMENTS

| | | | |
|---|---|---|---|
| 4,768,048 A | 8/1988 | Wakabayashi | |
| 5,430,516 A | 7/1995 | Uziie et al. | |
| 5,739,962 A | 4/1998 | Asakura et al. | |
| 6,031,998 A | 2/2000 | Shono | |
| 6,366,323 B1 | 4/2002 | Shono | |
| 6,978,089 B2 | 12/2005 | Nomura et al. | |
| 2003/0067544 A1 | 4/2003 | Wada | |
| 2003/0156832 A1 | 8/2003 | Nomura et al. | |
| 2004/0051967 A1 | 3/2004 | Nomura | |

FOREIGN PATENT DOCUMENTS

| | | |
|---|---|---|
| JP | 6-46314 | 2/1994 |
| JP | 2003-110928 | 4/2003 |
| JP | 2003-111449 | 4/2003 |
| JP | 2004-48266 | 2/2004 |

OTHER PUBLICATIONS

U.S. Appl. No. 11/289,556 to Nomura, filed Nov. 30, 2005.
U.S. Appl. No. 11/289,557 to Nomura, filed Nov. 30, 2005.
U.S. Appl. No. 11/289,478 to Nomura, filed Nov. 30, 2005.
U.S. Appl. No. 11/289,594 to Nomura, filed Nov. 30, 2005.
U.S. Appl. No. 11/289,600 to Nomura, filed Nov. 30, 2005.

(Continued)

Primary Examiner—W. B. Perkey
Assistant Examiner—David M. Schindler
(74) Attorney, Agent, or Firm—Greenblum & Bernstein, P.L.C.

(57) ABSTRACT

An imaging device includes an image sensor on which an object image is formed via a photographing optical system; a radially-retracting device which moves the image sensor between a photographing position, at which the image sensor is located on a common optical axis of the photographing optical system, and a radially-retracted position; and a flexible PWB for electrically connecting the image sensor to an image processing circuit. The flexible PWB includes a fixed portion positioned in front of the retracted position of the image sensor, and a free-deformable portion extending from the image sensor toward the fixed portion. The free-deformable portion forms a shape to accommodate and cover the image sensor when the image sensor is radially retracted to the radially-retracted position, and is extended to form a shape to uncover the image sensor when the image sensor is positioned in the photographing position.

8 Claims, 32 Drawing Sheets

OTHER PUBLICATIONS

U.S. Appl. No. 11/289,602 to Nomura, filed Nov. 30, 2005.
U.S. Appl. No. 11/289,481 to Nomura, filed Nov. 30, 2005.
U.S. Appl. No. 11/289,558 to Nomura, filed Nov. 30, 2005.
U.S. Appl. No. 11/289,601 to Nomura, filed Nov. 30, 2005.
U.S. Appl. No. 11/289,739 to Nomura, filed Nov. 30, 2005.
English Abstract of JP 6-46314.
English Abstract of JP2003-110928.
English Abstract of JP2003-111449.
English Abstract of JP2004-48266.
Reissue U.S. Appl. Nos. 10/815,193 and 10/815,194, filed Apr. 1, 2004.

IMAGING DEVICE CONTAINING FLEXIBLE PRINTED WIRING BOARD

BACKGROUND OF THE INVENTION

1. Field of the Invention

The present invention relates to an imaging device, more specifically relates to an imaging device containing a flexible printed wiring board which is connected to an electronic component such as an image sensor provided as an element of a photographing optical system.

2. Description of the Related Art

In a retractable type of photographic lens using no mirrors or prisms as refractors for refracting an optical axis of a photographing optical system (photographing optical axis), it is generally impossible to make the length of the photographic lens, in a retracted state, shorter than the sum of the thickness of the optical elements of the photographing optical system in the optical axis direction. Nevertheless, there has been a demand for a further reduction in length of the retracted photographic lens to achieve an extra-short photographic lens. As a solution to this demand, the assignee of the prevent invention has proposed a zoom lens whose length, in a retracted state, is further reduced by radially retracting a part of the photographing optical system away from the photographing optical axis thereof. This zoom lens is disclosed in U.S. patent Publication No. US2003/0156832 A1.

Such an element retractable from the photographing optical axis can be not only a lens group but also an electronic component such as an image sensor (image pickup device) or a shutter device. A flexible printed wiring board (flexible PWB) is suitable for establishing electrical connections between this type of electronic component and an electronic circuit. Although various wiring structures of flexible printed wiring boards which are connected to an electronic component which moves along the photographing optical axis have been proposed, it is difficult to carry out wiring of a flexible printed wiring board connected to a type of electronic component which moves from an on-axis position, in which the electronic component is positioned on the photographing optical axis, to an off-axis position, in which the electronic component is positioned away from the photographing optical axis, because the motion of such an electronic component is different from those of conventional similar electronic components. For instance, in the case where an electronic element retractable from the photographing optical axis is moved in a direction different from the retracting direction of the electronic element from the photographing optical axis from when the electric element is positioned on the photographing optical axis, a physical load tends to be applied on the electronic element by the flexible printed wiring board, so that it is desirable that such physical loads be reduced as much as possible. It is also desirable for the flexible printed wiring board to be accommodated with high efficiency in a wiring space when the electronic component is retracted away from the photographing optical axis.

SUMMARY OF THE INVENTION

The present invention provides an imaging device including an electronic component which is radially retractable away from a common optical axis of a photographing optical system, wherein wiring of a flexible printed wiring board, which is connected to the radially retractable electronic component, is carried out with high efficiency in a wiring space with less operating resistance to the retractable electronic component.

According to an aspect of the present invention, an imaging device is provided, including an image sensor on which an object image is formed via a photographing optical system; a radially-retracting device which moves the image sensor between a photographing position, at which the image sensor is located on a common optical axis of the photographing optical system in a photographic state, and a radially-retracted position, at which the image sensor is radially retracted away from the common optical axis in a non-photograph state; and a flexible PWB for electrically connecting the image sensor to an image processing circuit. The flexible PWB includes a fixed portion positioned in front of the image sensor when the image sensor is at the radially-retracted position of the image sensor; and a free-deformable portion extending from the image sensor toward the fixed portion. The free-deformable portion forms a shape so as to accommodate and cover the image sensor when the image sensor is radially retracted to the radially-retracted position, whereby a portion of the flexible PWB is located between the image sensor and the fixed portion. The free-deformable portion is extended to form a shape so as to uncover the image sensor when the image sensor is positioned in the photographing position, whereby no portion of the flexible PWB is located in front of the image sensor.

It is desirable for the free-deformable portion to include a first flat portion which is fixed at one end thereof to the back of the image sensor and extends toward the radially-retracted position of the image sensor; a U-shaped portion which is bent over forward from the first flat portion; and a second flat portion which extends from the U-shaped portion toward the photographing position of the image sensor and is substantially parallel to the first flat portion. The second flat portion is positioned in front of the image sensor to face the image sensor when the image sensor is in the radially-retracted position. When the image sensor is moved from the radially retracted position to the photographing position, it is desirable for the lengths of the first flat portion and the second flat portion to relatively vary to increase and decrease, respectively, while the U-shaped portion is moved toward the photographing position.

It is desirable for the image sensor to be moved linearly in a direction perpendicular to the common optical axis between the photographing position and the radially-retracted position by the radially-retracting device.

It is desirable for the imaging device to include an image-shake detection sensor for detecting a magnitude and a direction of vibration applied to the photographing optical system; and an image stabilizer which moves the image sensor in a plane orthogonal to the common optical axis so as to counteract the vibration in accordance with an output of the image-shake detection sensor when the image sensor is in the photographing position.

It is desirable for the imaging device to include a retractable optical unit including the image sensor and at least one optical element positioned in front of the image sensor, wherein the retractable optical unit is fixed to one end of the free-deformable portion.

It is desirable for the imaging device to include a telescoping lens barrel consisting of concentrically-arranged movable barrels. The image sensor is moved to the radially-retracted position so as to be positioned radially outside of the telescoping lens barrel when the telescoping lens barrel is fully retracted linearly.

It is desirable for the imaging device to include a stationary housing which supports the photographing optical system, wherein the fixed portion of the flexible PWB is fixed to an inner surface of the stationary housing.

In an embodiment, an imaging device is provided, including an electronic component provided in a photographing optical system;

a radially-retracting device which moves the electronic component between a photographing position, at which the electronic component is located on a common optical axis of the photographing optical system in a photographic state, and a radially-retracted position, at which the electronic component is radially retracted away from the common optical axis in a non-photograph state; and a flexible PWB connected to the electronic component. The flexible PWB includes a fixed portion positioned adjacent to the radially-retracted position of the electronic component; and a free-deformable portion extending from the electronic component toward the fixed portion. The free-deformable portion forms a shape so as to accommodate and cover the electronic component when the electronic component is retracted to the radially-retracted position. The free-deformable portion is extended to form a shape so as to uncover the electronic component when the electronic component is positioned in the photographing position.

According to the present invention, the flexile PWB is installed with high efficiency in a wiring space, and also the degree of flexibility in the flexible PWB is increased with less operating resistance to the electronic component (e.g., an image sensor) during movement of the electronic component because the free-deformable portion forms a shape so as to accommodate and cover the electronic component when the electronic component is radially retracted to the radially retracted position away from the common optical axis, and is extended to form a shape so as to uncover the electronic component when the electronic component is positioned in the photographing position on the common optical axis.

The present disclosure relates to subject matter contained in Japanese Patent Application No. 2004-349190 (filed on Dec. 1, 2004), which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENTS

Figure 1:
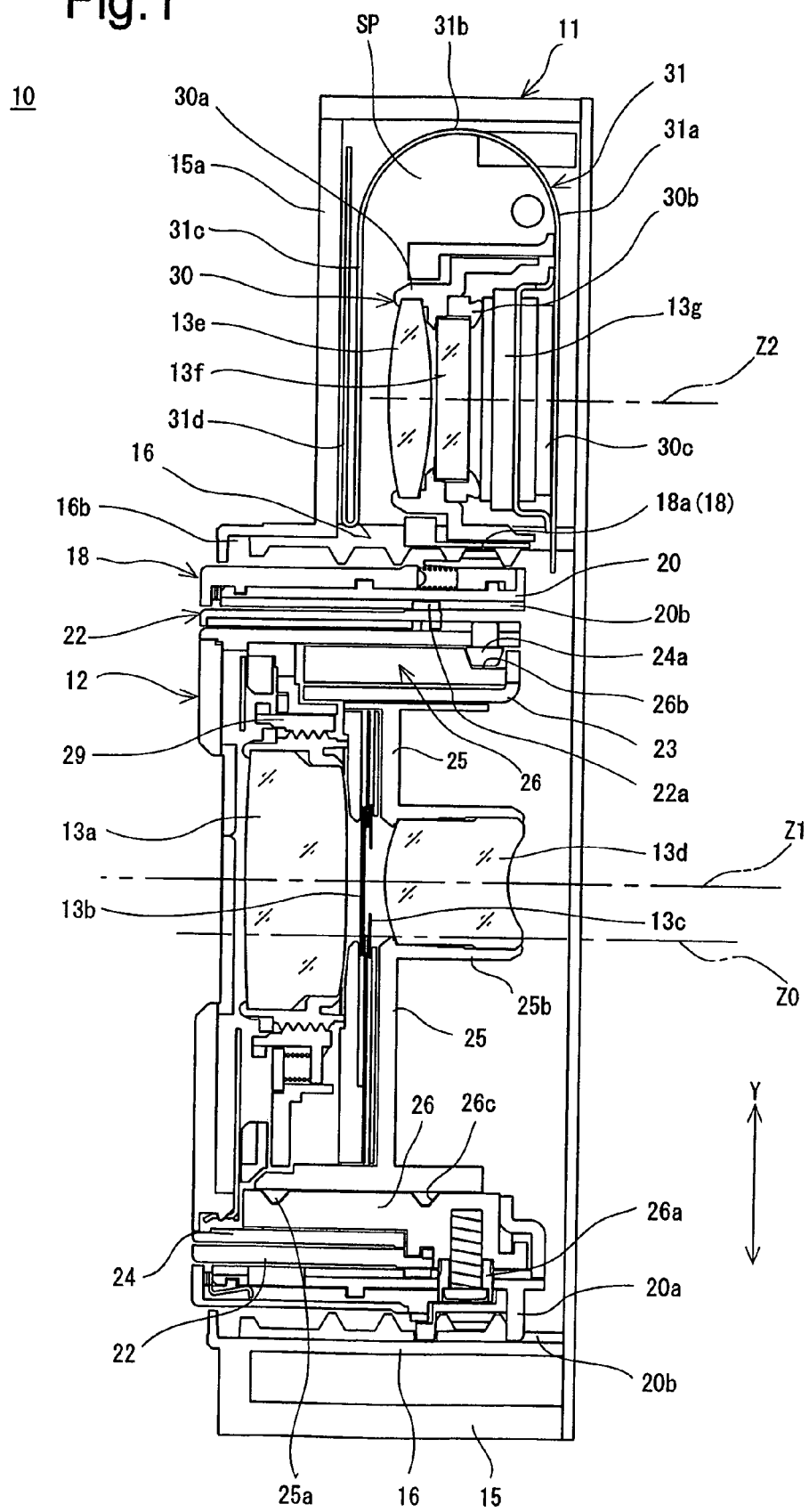
FIG. 1 is a cross-sectional view of an embodiment of a retractable zoom lens to which the present invention is applied in the retracted state of the zoom lens barrel.
Figure 2:
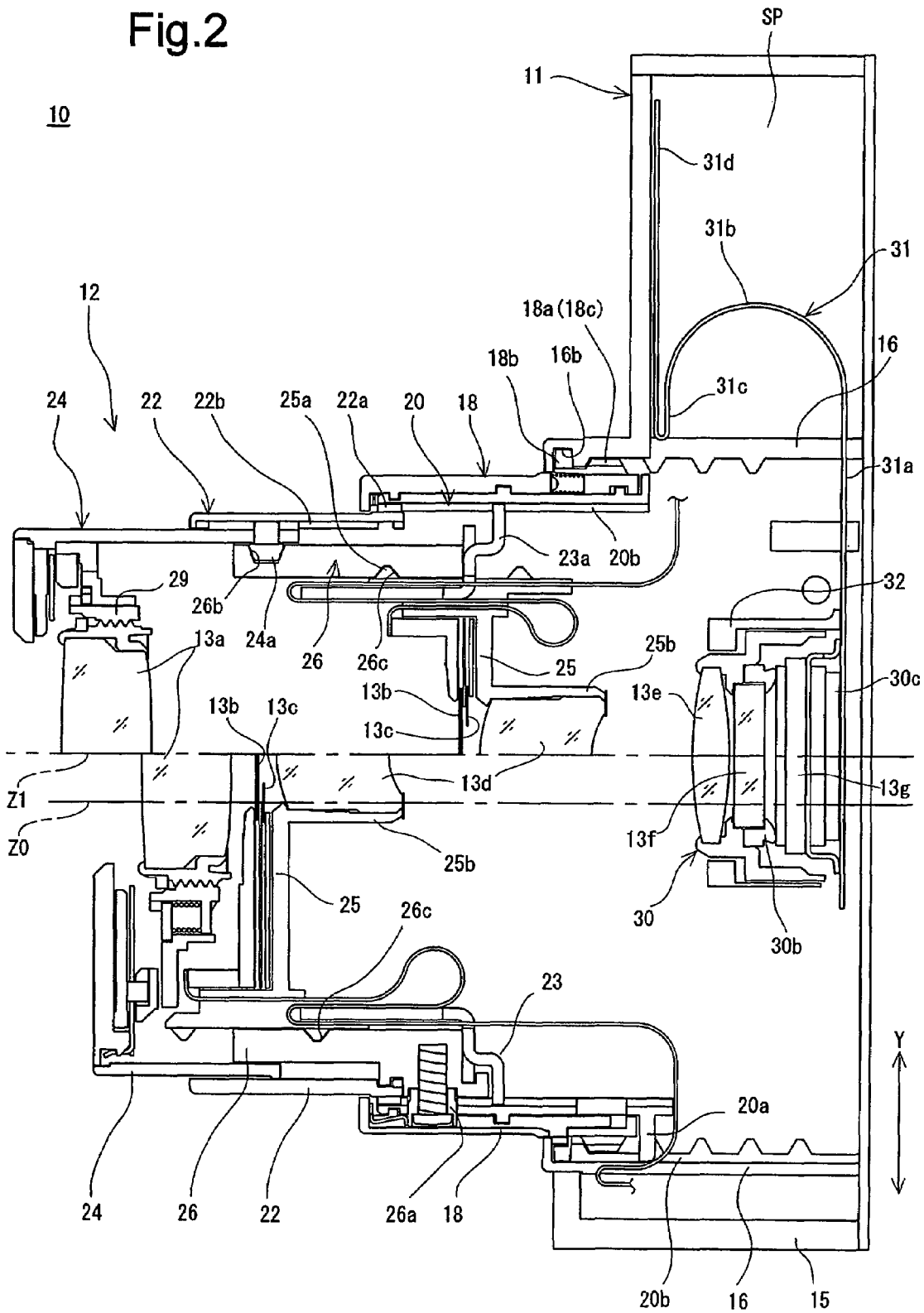
FIG. 2 is a cross-sectional view of the zoom lens shown in FIG. 1 in a photographic state of the zoom lens.
Figure 5:
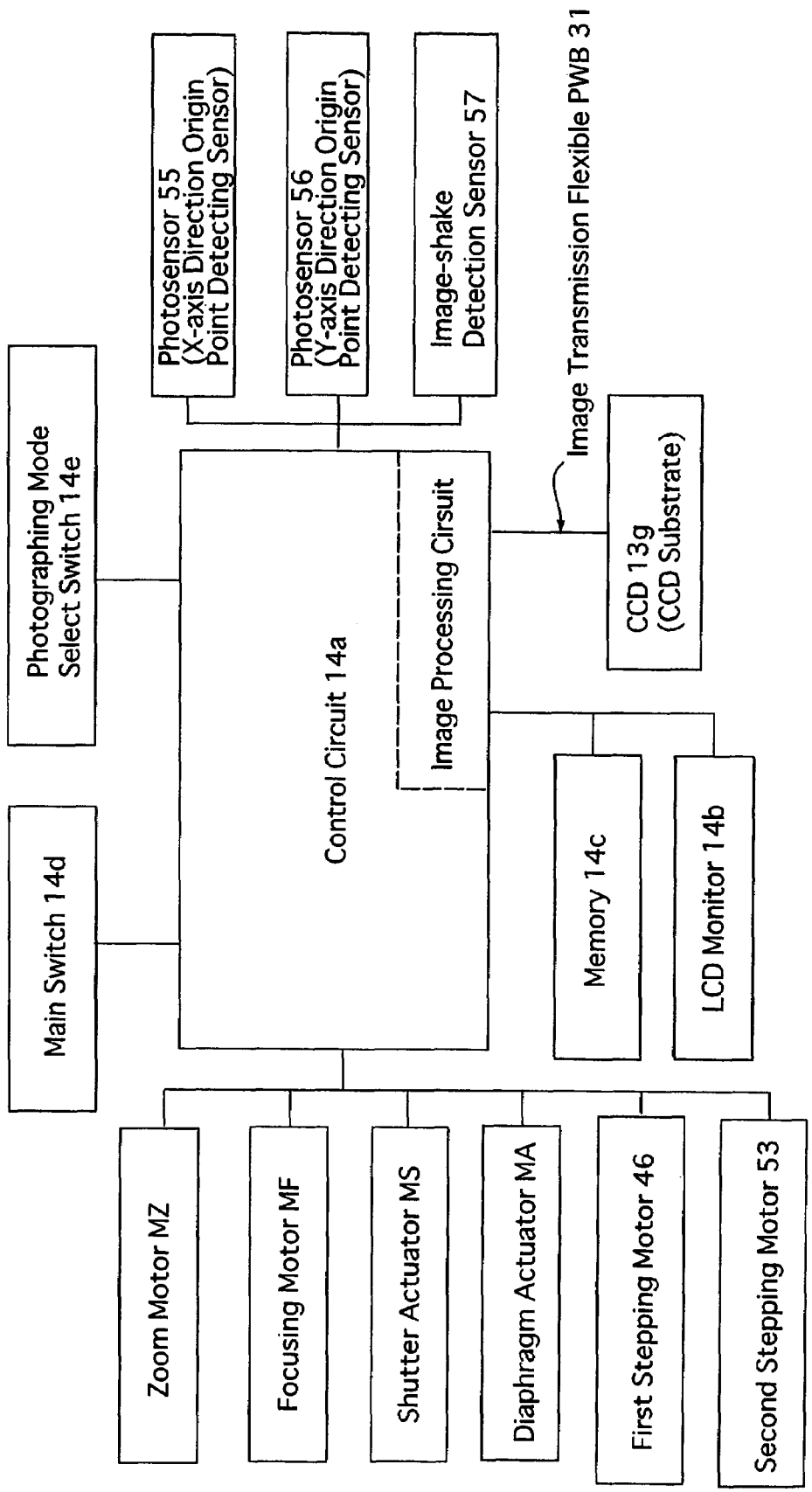
FIG. 5 is a block diagram illustrating a configuration of electrical circuits of a camera equipped with the zoom lens shown in FIGS. 1 and 2.

FIGS. 1 and 2 show cross-sections of a zoom lens 10 which is incorporated in a zoom lens camera. The zoom lens 10 is provided with a box-shaped housing 11 and a retractable barrel portion 12 retractably supported inside the housing 11. The outside of the housing 11 is covered by exterior components of the camera; the exterior components are not shown in the drawings. A photographing optical system of the zoom lens 10 includes a first lens group 13a, a shutter 13b, a diaphragm 13c, a second lens group 13d, a third lens group 13e, a low-pass filter 13f, and a CCD image sensor 13g (hereinafter referred to as CCD), in that order from the object side (the left side as viewed in FIGS. 1 and 2). As shown in FIG. 5, the CCD 13g is electrically connected to a control circuit 14a having an image processing circuit. Thus, an electronic image can be displayed on an LCD monitor 14b provided on an outer surface of the camera, and the electronic image data can be recorded in a memory 14c. In a photographic state (ready-to-photograph state) of the zoom lens 10 shown in FIG. 2, all of the optical elements constituting the photographing optical system are aligned on the same photographing optical axis Z1. On the other hand, in an accommodated (radially retracted) state of the zoom lens 10 shown in FIG. 1, the third lens group 13e, the low-pass filter 13f and the CCD 13g are moved away from the photographing optical axis Z1 to be radially retracted upward in the housing 11, and the second lens group 13d is linearly retracted into the space created as a result of the upward radial retracting movement of the third lens group 13e, the low-pass filter 13f and the CCD 13g, which reduces the length of the zoom lens 10 in the retracted state thereof. The overall structure of the zoom lens 10 that includes a radially-retracting mechanism for radially retracting optical elements upward will be described hereinafter. In the following description, the vertical direction and the horizontal direction of the zoom lens camera body equipped with the zoom lens 10 as viewed from the front thereof are defined as a y-axis and an x-axis, respectively.

The housing 11 is provided with a hollow box-shaped portion 15 and a hollow fixed ring portion 16 which is formed on a front wall 15a of the box-shaped portion 15 so as to enclose the photographing optical system about the photographing optical axis Z1. A rotation center axis Z0 serving as the center of the fixed ring portion 16 is parallel to the photographing optical axis Z1 and eccentrically located below the photographing optical axis Z1. A retraction space (accommodation space) SP (FIGS. 1 and 2) is formed inside the box-shaped portion 15 and above the fixed ring portion 16.

Figure 8:
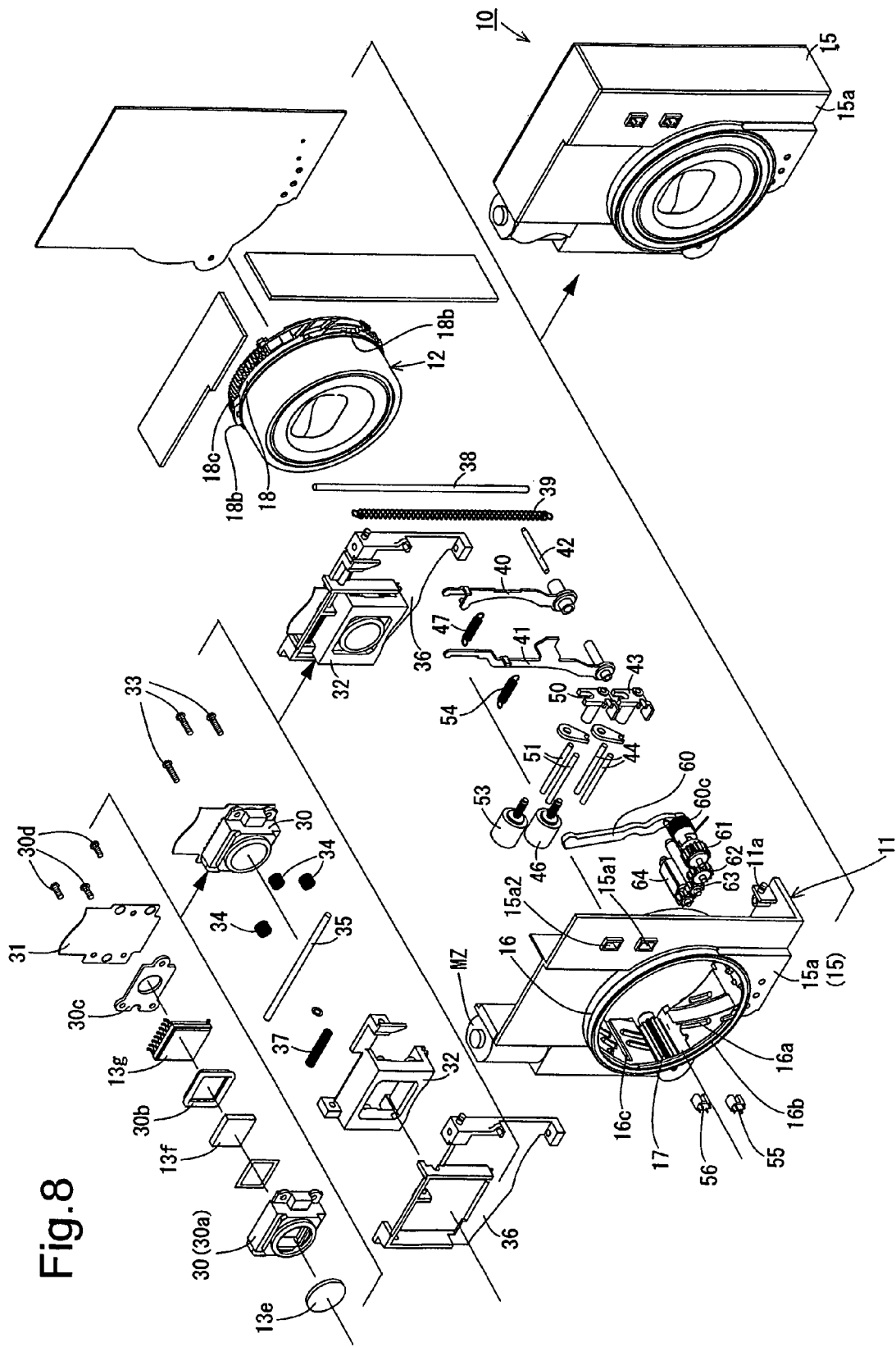
FIG. 8 is an exploded perspective view of the zoom lens shown in FIGS. 1 and 2.

A zoom gear 17 (FIGS. 8, 10 and 11) is supported on an inner peripheral surface side of the fixed ring portion 16 to be rotatable on an axis of rotation parallel to the rotation center axis Z0. The zoom gear 17 is rotated forward and reverse by a zoom motor MZ (FIGS. 5, 10, and 11) supported by the housing 11. In addition, the fixed ring portion 16 is provided on an inner peripheral surface thereof with a female helicoid 16a, a circumferential groove 16b and a plurality of linear guide grooves 16c (only one of them is shown in FIG. 8). The circumferential groove 16b is an annular groove with its center on the rotation center axis Z0, while the plurality of the linear guide grooves 16c are parallel to the rotation center axis Z0 (see FIGS. 3, 4 and 8).

Figure 10:
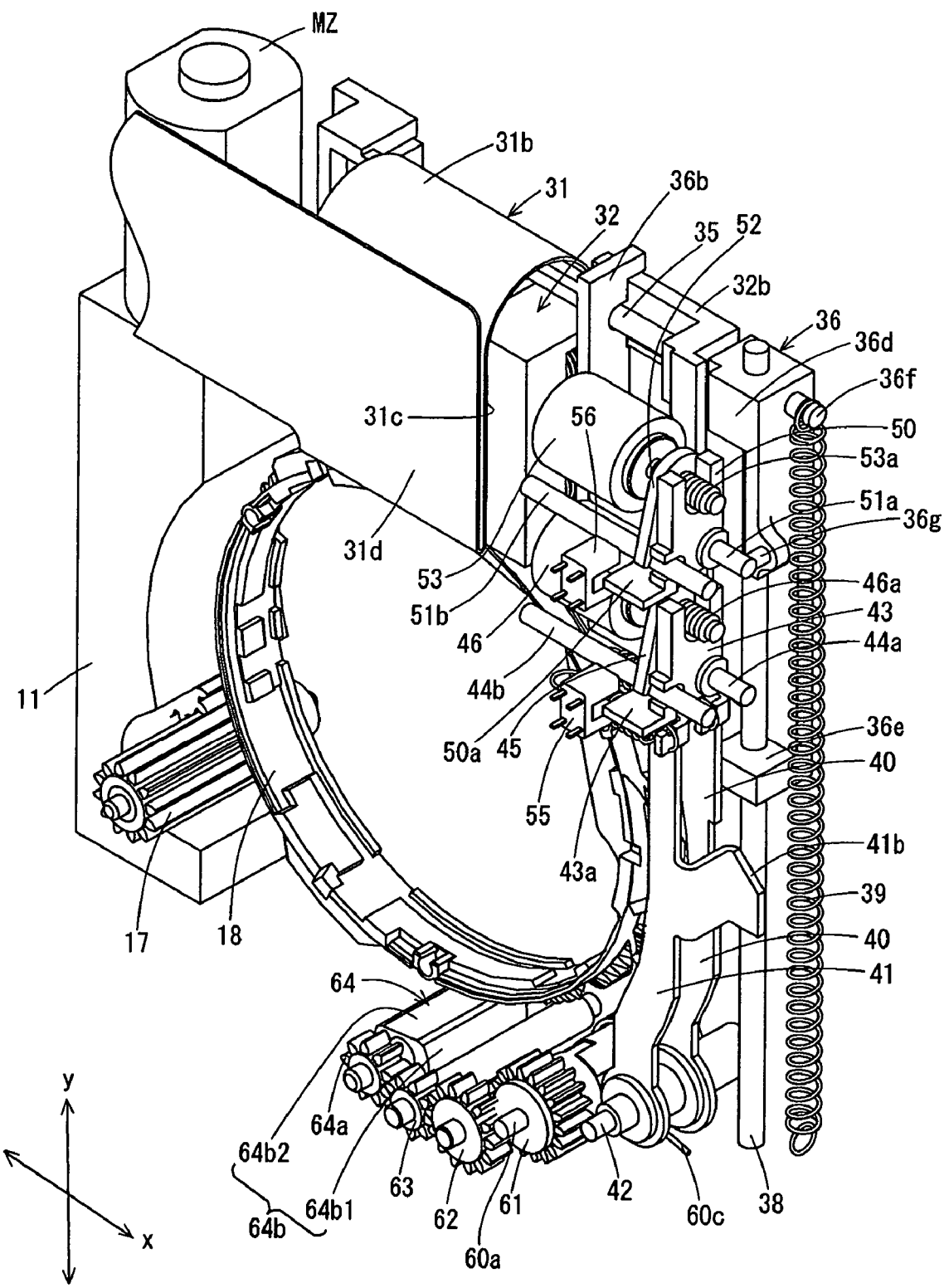
FIG. 10 is a front perspective view of the image stabilizing mechanism and the radially-retracting mechanism, illustrating the retracted state of a CCD holder in the retracted state of the zoom lens shown in FIG. 1.
Figure 11:
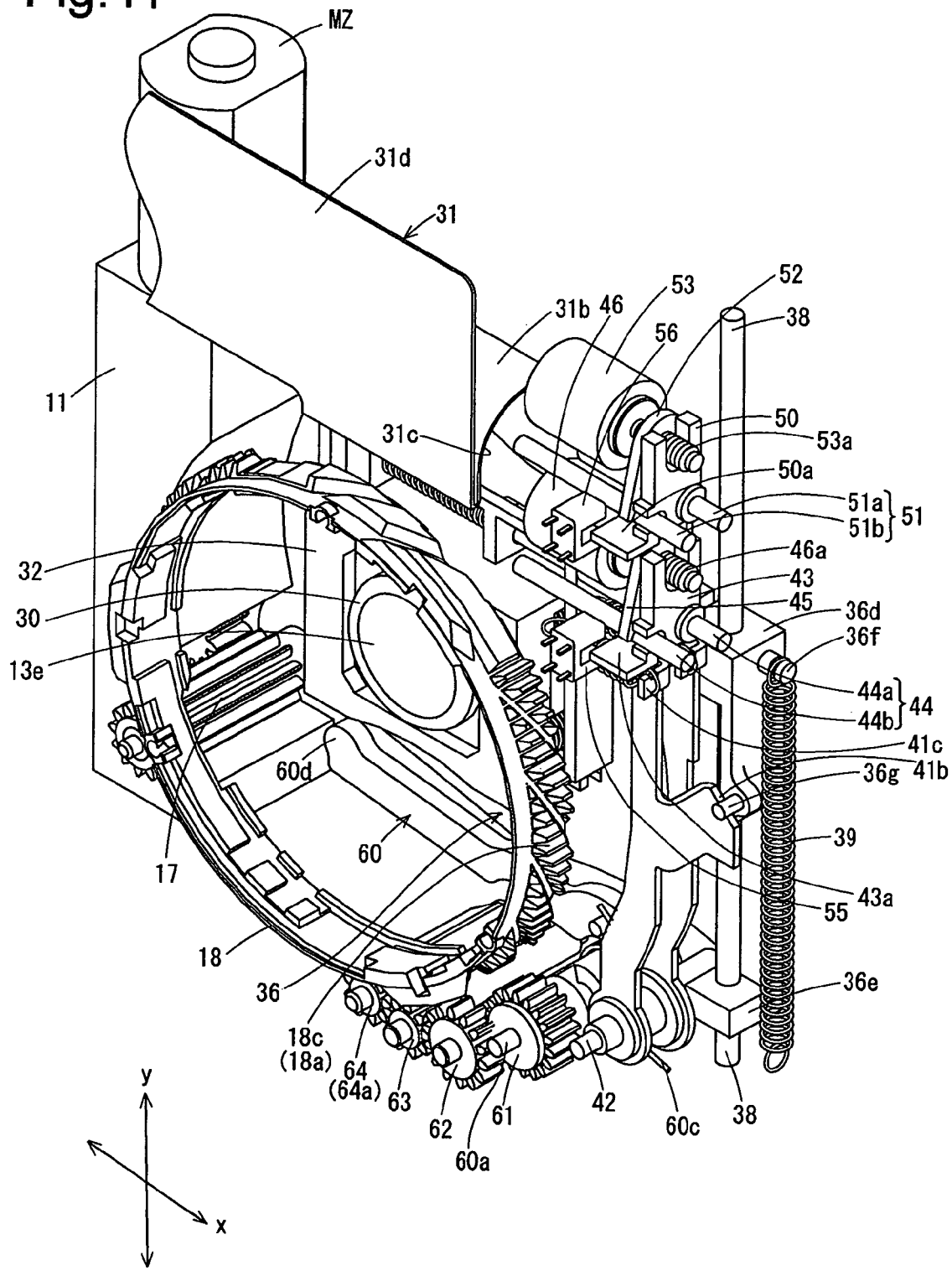
FIG. 11 is a front perspective view of the image stabilizing mechanism and the radially-retracting mechanism, illustrating the optical-axis advanced state of the CCD holder in a photographic state of the zoom lens.

A helicoid ring (movable barrel) 18 is supported inside the fixed ring portion 16 to be rotatable about the rotation center axis Z0. The helicoid ring 18 is provided with a male helicoid 18a which is engaged with the female helicoid 16a of the fixed ring portion 16 and thus can advance and retract in the optical axis direction while rotating due to the engagement of the female helicoid 16a with the male helicoid 18a. The helicoid ring 18 is further provided, on an outer peripheral surface thereof in front of the female helicoid 18a, with a plurality of rotation guiding protrusions 18b (only two of them are shown in FIG. 8). In a state shown in FIGS. 2 through 4 in which the helicoid ring 18 advances to the frontmost position thereof with respect to the fixed ring portion 16, the female helicoid 16a and the male helicoid 18a are disengaged from each other while the plurality of rotation guiding protrusions 18b are slidably fitted in the circumferential groove 16b so that the helicoid ring 18 is prevented from further moving in the optical axis direction and is allowed only to rotate at a fixed position in the optical axis direction. The helicoid ring 18 is further provided on threads of the male helicoid 18a with an annular spur gear 18c which is in mesh with the zoom gear 17. Teeth of the spur gear 18c are aligned parallel to the photographing optical axis Z1. The zoom gear 17 is elongated in the axial direction thereof so as to remain engaged with the spur gear 18c at all times over the entire range of movement of the helicoid ring 18 from a retracted state of the helicoid ring 18 shown in FIGS. 1 and 10 to an extended state of the helicoid ring 18 shown in FIGS. 2 and 11. The helicoid ring 18 is constructed by combining two ring members which are splittable in the optical axis direction. In FIGS. 10 and 11, only the rear ring member of the helicoid ring 18 is shown.

Figure 3:
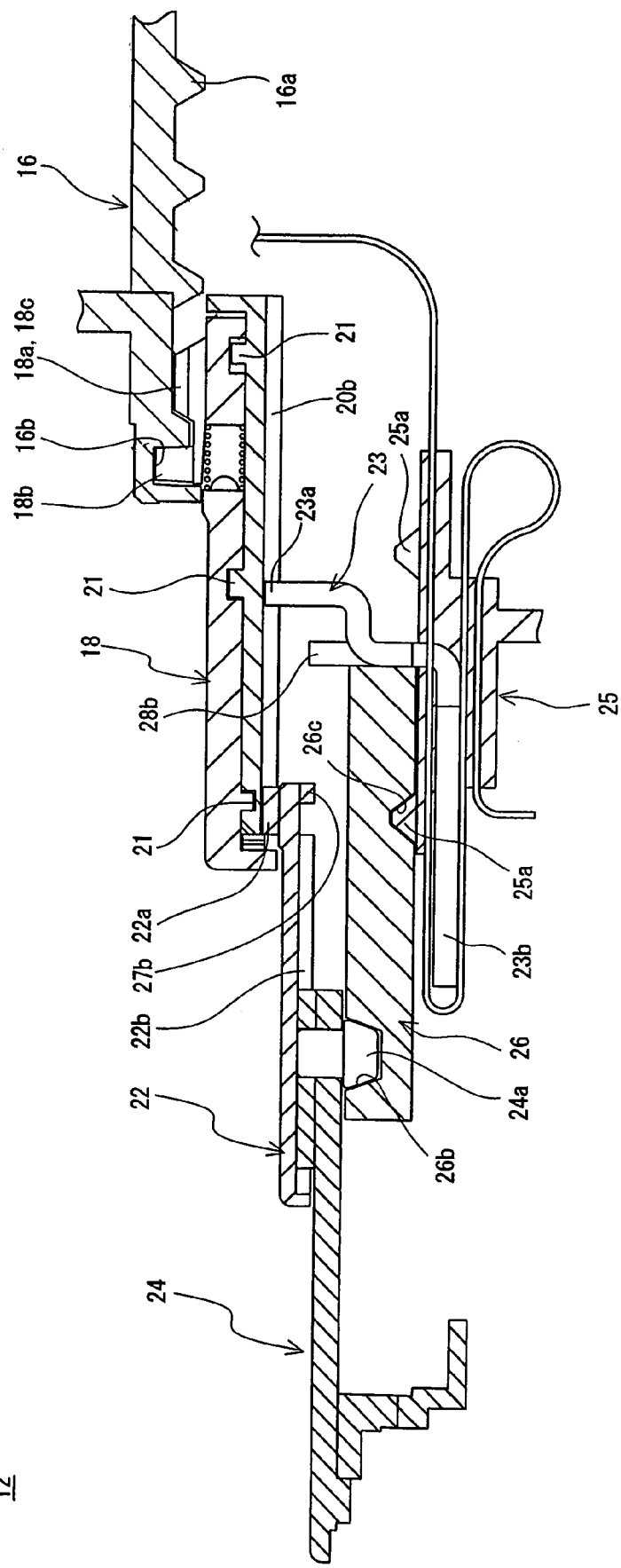
FIG. 3 is an enlarged cross-sectional view of a part of the zoom lens at the wide-angle extremity thereof.
Figure 4:
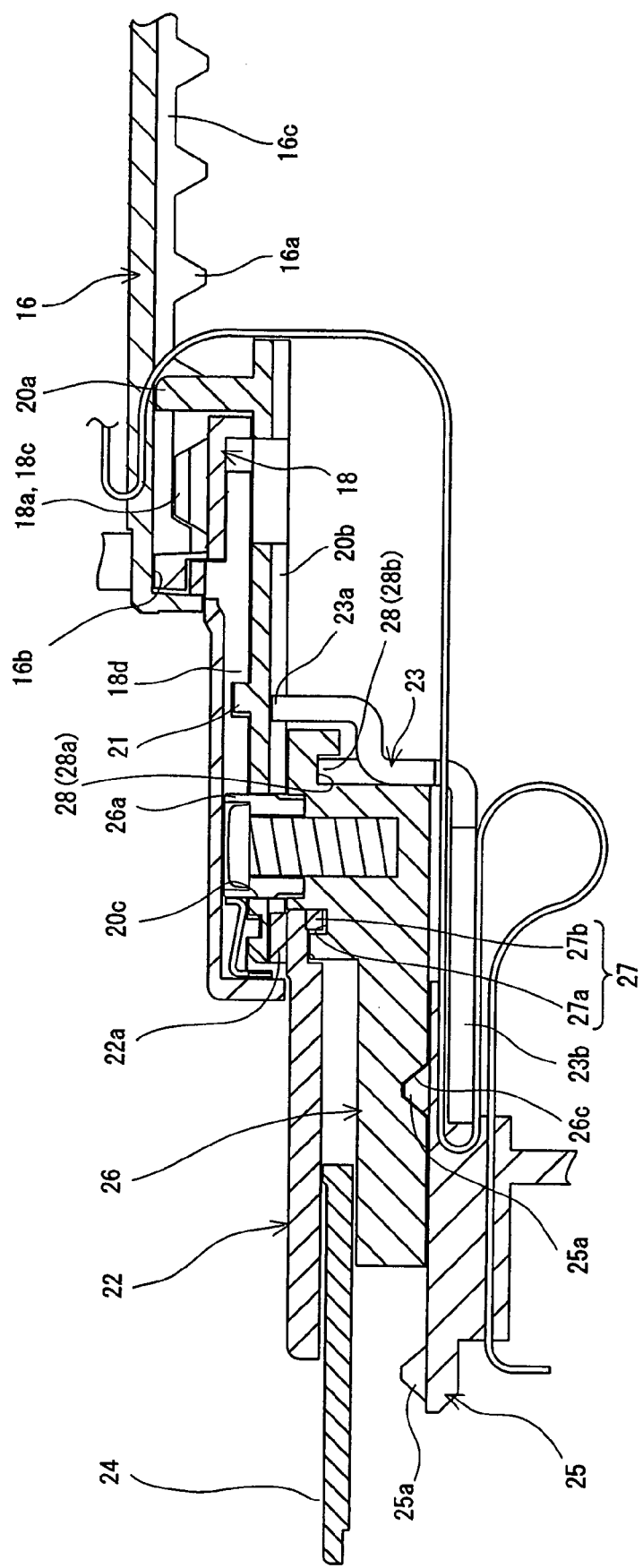
FIG. 4 is an enlarged cross-sectional view of a part of the zoom lens at the telephoto extremity thereof.

A linear guide ring 20 is supported inside the helicoid ring 18. The linear guide ring 20 is provided in the vicinity of the rear end thereof with a linear guide projection 20a, and is guided linearly along the rotation center axis Z0 (and the photographing optical axis Z1) by the slidable engagement of the linear guide projection 20a with the linear guide groove 16c of the fixed ring portion 16 as shown in FIG. 4. A rotation guiding portion 21 is provided between the inner peripheral surface of the helicoid ring 18 and the outer peripheral surface of the linear guide ring 20. The helicoid ring 18 is supported by the linear guide ring 20 to be rotatable with respect to the linear guide ring 20 and to be movable together with the linear guide ring 20 in the optical axis direction via the rotation guiding portion 21. The rotation guiding portion 21 consists of a plurality of circumferential grooves provided at different positions in the axial direction and radial protrusions, each of which is slidably engaged in the corresponding circumferential groove (see FIGS. 3 and 4).

The linear guide ring 20 is provided on an inner peripheral surface thereof with a plurality of linear guide grooves 20b (only one of them is shown in each of FIGS. 1 through 4) which extend parallel to the rotation center axis Z0 (and the photographing optical axis Z1). A plurality of linear guide projections 22a (only one of them is shown in each of FIGS. 1 through 4) which project radially outwards from a first lens group linear guide ring (movable barrel) 22 and a plurality of linear guide projections 23a (only one of them is shown in each of FIGS. 1 through 4) which project radially outwards from a second lens group linear guide ring 23 are slidably engaged with the plurality of linear guide grooves 20b, respectively. The first lens group linear guide ring 22 guides a first lens group support frame (movable barrel) 24 linearly in a direction parallel to the rotation center axis Z0 (and the photographing optical axis Z1) via a plurality of linear guide grooves 22b (only one of them is shown in each of FIGS. 2 and 3) formed on an inner peripheral surface of the first lens group linear guide ring 22. The second lens group linear guide ring 23 guides a second lens group support frame 25 linearly in a direction parallel to the rotation center axis Z0 (and the photographing optical axis Z1) via a plurality of linear guide keys 23b (only one of them is shown in each of FIGS. 1 through 4). The first lens group support frame 24 supports the first lens group 13a via a focusing frame 29, and the second lens group support frame 25 supports the second lens group 13d.

A cam ring 26 is provided inside the linear guide ring 20 to be rotatable about the rotation center axis Z0. The cam ring 26 is supported by the first lens group linear guide ring 22 and the second lens group linear guide ring 23 to be rotatable with respect to each of the first lens group linear guide ring 22 and the second lens group linear guide ring 23 and to movable in the optical axis direction together therewith via rotation guiding portions 27 and 28 (see FIG. 4). As shown in FIGS. 3 and 4, the rotation guiding portion 27 is composed of a discontinuous circumferential groove 27a (not shown in FIG. 3) which is formed on an outer peripheral surface of the cam ring 26, and an inner flange 27b which projects radially inwards from the first lens group linear guide ring 22 to be slidably engaged in the discontinuous circumferential groove 27a. As shown in FIGS. 3 and 4, the rotation guiding portion 28 is composed of a discontinuous circumferential groove 28a (not shown in FIG. 3) formed on an inner peripheral surface of the cam ring 26 and an outer flange 28b which projects radially outwards from the second lens group linear guide ring 23 to be slidably engaged in the discontinuous circumferential groove 28a.

As shown in FIG. 4, the cam ring 26 is provided thereon with a plurality of follower protrusions 26a (only one of them is shown in FIG. 4) which project radially outwards. The plurality of follower protrusions 26a passes through a plurality of follower guide slots 20c (only one of them is shown in FIG. 4) formed in the linear guide ring 20 to be engaged in a plurality of rotation transfer grooves 18d (only one of them is shown in FIG. 4) formed on an inner peripheral surface of the helicoid ring 18. Each rotation transfer groove 18d is parallel to the rotation center axis Z0 (and the photographing optical axis Z1), and each follower protrusion 26a is slidably engaged in the associated rotation transfer groove 18d to be prevented from moving in the circumferential direction relative to the associated rotation transfer groove 18d. Accordingly, the rotation of the helicoid ring 18 is transferred to the cam ring 26 via the engagement between the plurality of rotation transfer grooves 18d and the plurality of follower protrusions 26a. Although the development shape of each follower guide groove 20c is not shown in the drawings, each follower guide groove 20c is a guide groove including a circumferential groove portion with its center on the rotation center axis Z0 and an inclined lead groove portion parallel to the female helicoid 16a. Accordingly, when rotated by a rotation of the helicoid ring 18, the cam ring 26 rotates while moving forward or rearward along the rotation center axis Z0 (and the photographing optical axis Z1) if each follower protrusion 26a is engaged in the lead groove portion of the associated follower guide groove 20c, and rotates at a fixed position in the optical axis direction without moving forward or rearward if each follower protrusion 26a is engaged in the circumferential groove portion of the associated follower guide groove 20c.

The cam ring 26 is a double-sided cam ring having a plurality of outer cam grooves 26b (only one of them is shown in FIG. 3) and a plurality of inner cam grooves 26c (only one of them is shown in each of FIGS. 3 and 4) on outer and inner peripheral surfaces of the cam ring 26, respectively. The plurality of outer cam grooves 26b are slidably engaged with a plurality of cam followers 24a (only one of them is shown in FIG. 3) which project radially inwards from the first lens group support frame 24, respectively, while the plurality of inner cam grooves 26c are slidably engaged with a plurality of cam followers 25a (only one of them is shown in each of FIGS. 3 and 4) which project radially outwards from the second lens group support frame 25. Accordingly, when the cam ring 26 is rotated, the first lens group support frame 24 that is guided linearly in the optical axis direction by the first lens group linear guide ring 22 moves forward and rearward along the rotation center axis Z0 (and the photographing optical axis Z1) in predetermined motion in accordance with contours of the plurality of outer cam grooves 26b. likewise, when the cam ring 26 is rotated, the second lens group support frame 25 that is guided linearly in the optical axis direction by the second lens group linear guide ring 23 moves forward and rearward along the rotation center axis Z0 (and the photographing optical axis Z1) in predetermined motion in accordance with contours of the plurality of the plurality of inner cam grooves 26c.

The second lens group support frame 25 is provided with a cylindrical portion 25b (see FIGS. 1 and 2) which holds the second lens group 13d, and supports the shutter 13b and the diaphragm 13c in front of the cylindrical portion 25b to allow each of the shutter 13b and the diaphragm 13c to be opened and closed. The shutter 13b and the diaphragm 13c can be opened and closed by a shutter actuator MS and a diaphragm actuator MA, respectively, which are supported by the second lens group support frame 25 (see FIGS. 5 and 15).

The focusing frame 29 which holds the first lens group 13a is supported by the first lens group support frame 24 to be movable along the rotation center axis Z0 (and the photographing optical axis Z1). The focusing frame 29 can be moved forward and rearward by a focusing motor MF (see FIG. 5).

The operation of each of the zoom motor MZ, the shutter actuator MS, the diaphragm actuator MA and the focusing motor MF is controlled by the control circuit 14a. Upon turning on a main switch 14d (see FIG. 5) of the camera, the zoom motor MZ is driven to bring the zoom lens 10 to the photographic state shown in FIG. 2. Upon turning off the main switch 14d, the zoom lens 10 is moved from the photographic state to the retracted state shown in FIG. 1.

The above described operation of the zoom lens 10 is summarized as follows. Upon turning on the main switch 14d in the retracted state of the zoom lens 10 shown in FIG. 1, the zoom gear 17 is driven to rotate in a lens barrel advancing direction. Accordingly, the helicoid ring 18 moves forward in the optical axis direction while rotating, and simultaneously, the linear guide ring 20 linearly moves forward in the optical axis direction together with the helicoid ring 18. In addition, the rotation of the helicoid ring 18 causes the cam ring 26 to move forward in the optical axis direction while rotating relative to the linear guide ring 20. The first lens group linear guide ring 22 and the second lens group linear guide ring 23 linearly move forward in the optical axis direction together with the cam ring 26. Each of the first lens group support frame 24 and the second lens group support frame 25 moves in the optical axis direction relative to the cam ring 26 in predetermined motion. Therefore, the moving amount of the first lens group 13a in the optical axis direction when the zoom lens 10 is extended from the retracted state thereof is determined by adding the moving amount of the cam ring 26 relative to the fixed ring portion 16 to the moving amount of the first lens group support frame 24 relative to the cam ring 26 (the advancing/retracting amount of the first lens group support frame 24 by the cam groove 26b). Furthermore, the moving amount of the second lens group 13d in the optical axis direction when the zoom lens 10 is extended from the retracted state thereof is determined by adding the moving amount of the cam ring 26 relative to the fixed ring portion 16 to the moving amount of the second lens group support frame 25 relative to the cam ring 26 (the advancing/retracting amount of the second lens group support frame 25 by the cam groove 26c).

Figure 6:
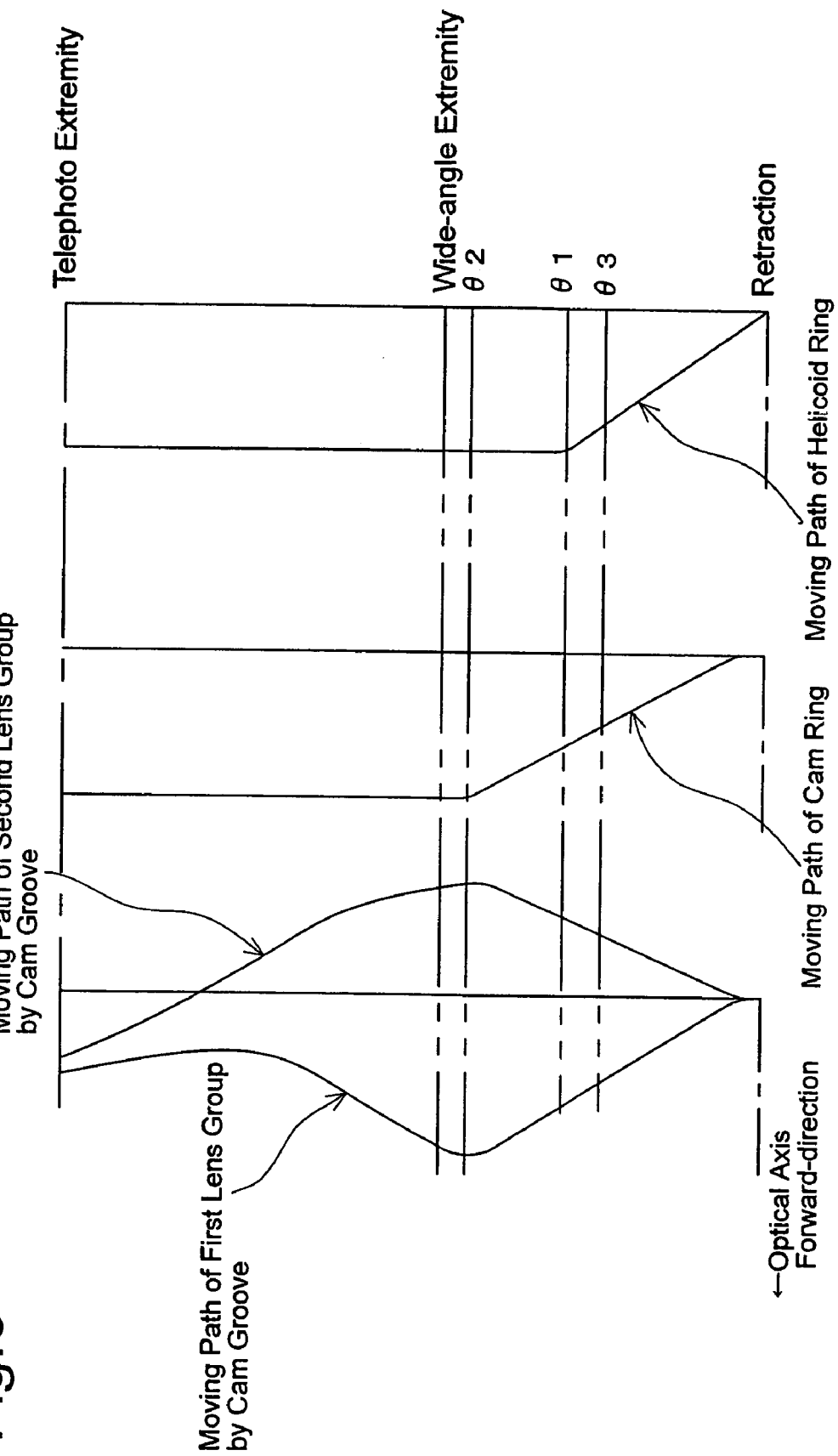
FIG. 6 is a conceptual diagram showing the moving paths of a helicoid ring and a cam ring and the moving paths of a first lens group and a second lens group by movement of the cam ring.
Figure 7:
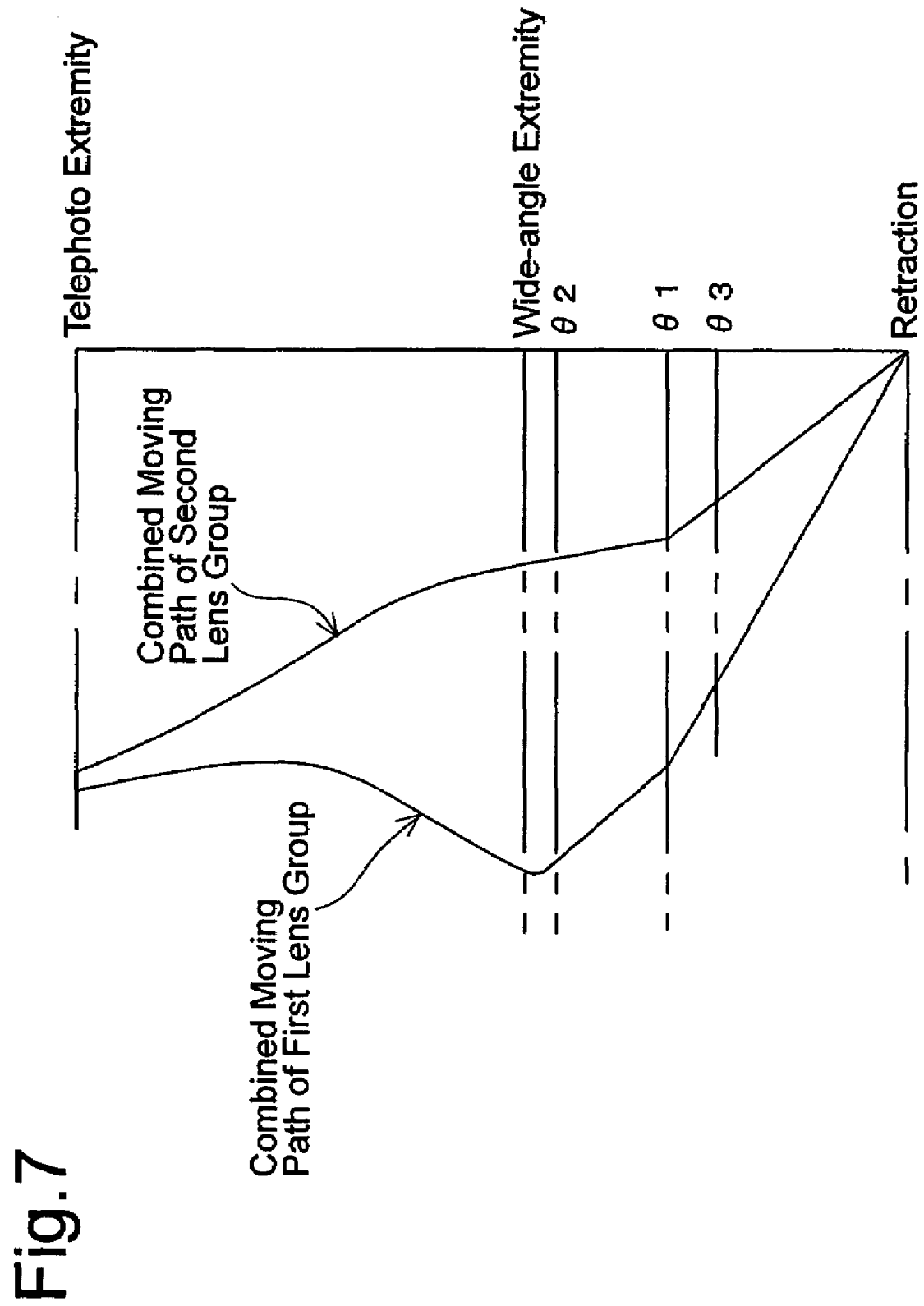
FIG. 7 is a conceptual diagram showing the combined moving path of each of the first lens group and the second lens group, in which the moving paths of the helicoid ring and the cam ring are included.

FIG. 6 shows the moving paths of the helicoid ring 18 and the cam ring 26 and the moving paths of the first lens group 13a and the second lens group 13d relative to the cam ring 26 (the cam diagrams of the cam grooves 26b and 26c). The vertical axis represents the amount of rotation (angular position) of the lens barrel from the retracted state of the zoom lens 10 to the telephoto extremity thereof, and the horizontal axis represents the amount of movement of the lens barrel in the optical axis direction. As shown in FIG. 6, the helicoid ring 18 is moved forward in the optical axis direction while rotating up to an angular position θ1 which is located at about the midpoint in the range of extension of the zoom lens 10 from the retracted position (shown in FIG. 1) to the wide-angle extremity (shown by the upper half of the zoom lens 10 from the photographing optical axis Z1 and shown in FIG. 2), whereas the helicoid ring 18 rotates at a fixed position in the optical axis direction as described above in the range of extension of the zoom lens 10 from the angular position θ1 to the telephoto extremity (shown by the lower half of the zoom lens 10 from the photographing optical axis Z1 and shown in FIG. 4). On the other hand, the cam ring 26 is moved forward in the optical axis direction while rotating up to an angular position θ2 which is located immediately behind the wide-angle extremity of the zoom lens 10 in the range of extension of the zoom lens 10 from the retracted position to the wide-angle extremity, whereas the cam ring 26 rotates at a fixed position in the optical axis direction as described above in the range of extension of the zoom lens 10 from the angular position θ2 to the telephoto extremity, similar to the helicoid ring 18. In the zooming range from the wide-angle extremity to the telephoto-extremity, the moving amount of the first lens group 13a in the optical axis direction is determined from the moving amount of the first lens group support frame 24 relative to the cam ring 26 which rotates at a fixed position in the optical axis direction (the advancing/retracting amount of the first lens group support frame 24 via the cam groove 26b), while the moving amount of the second lens group 13d in the optical axis direction is determined from the moving amount of the second lens group support frame 25 relative to the cam ring 26 which rotates at a fixed position in the optical axis direction (the advancing/retracting amount of the second lens group support frame 25 via the cam groove 26c). The focal length of the zoom lens 10 is varied by the relative movement in the optical axis direction between the first lens group 13a and the second lens group 13d. FIG. 7 shows the actual moving path of the first lens group 13a which is obtained by combining the moving amounts of the helicoid ring 18 and the cam ring 26 with the moving amount of the first lens group 13a by the cam groove 26b, and the actual moving path of the second lens group 13d which is obtained by combining the moving amounts of the helicoid ring 18 and the cam ring 26 with the moving amount by the cam groove 26c.

In the zooming range from the wide-angle extremity to the telephoto extremity, a focusing operation is performed by moving the first lens group 13a in the optical axis direction independently of other optical elements by the focusing motor MF.

The operations of the first lens group 13a and the second lens group 13d have been described above. In the zoom lens 10 of the present embodiment, the optical elements of the zoom lens 10 from the third lens group 13e to the CCD 13g are retractable away from the photographing position on the photographing optical axis Z1 to an off-optical-axis retracted position (radially retracted position) Z2 located above the photographing position as described above. In addition, by moving the optical elements from the third lens group 13e to the CCD 13g on a plane perpendicular to the photographing optical axis Z1, image shake can also be counteracted. The retracting mechanism and the image stabilizing mechanism will be discussed hereinafter.

Figure 18:
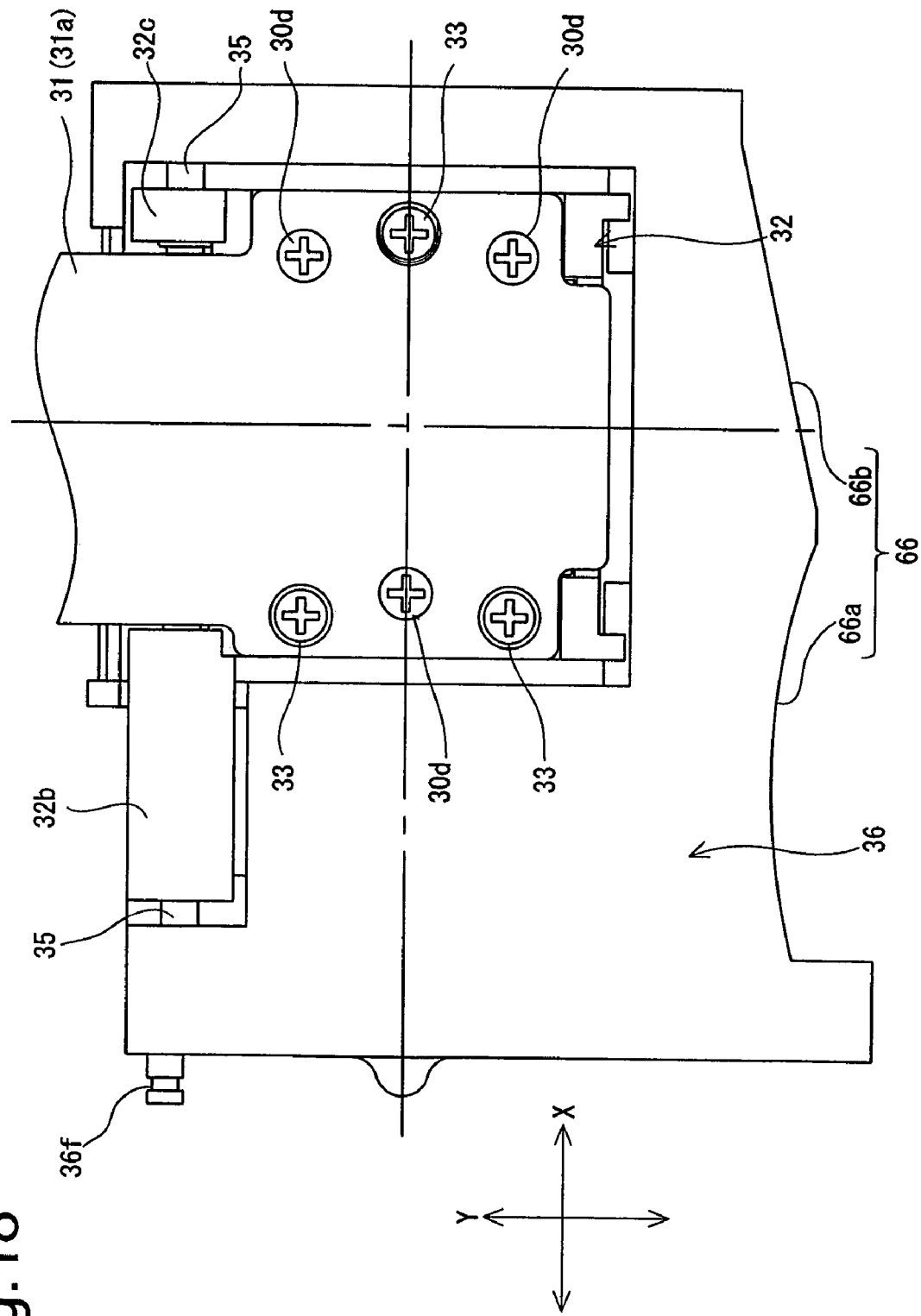
FIG. 18 is a rear view of the horizontal moving frame, the vertical moving frame and the associated elements shown in FIGS. 16 and 17.
Figure 19:
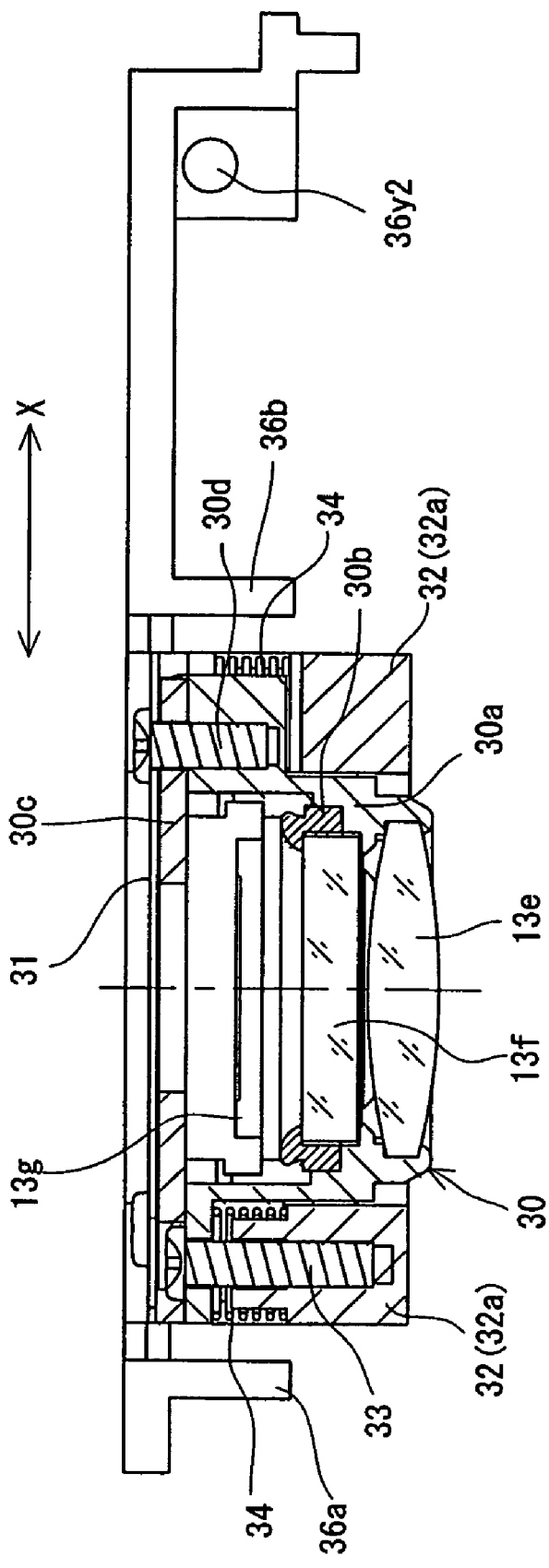
FIG. 19 is a cross-sectional view of the CCD holder, the horizontal moving frame, the vertical moving frame and other elements, taken along D1-D1 line shown in FIG. 17.

As shown in FIGS. 8 and 19, the third lens group 13e, the low-pass filter 13f and the CCD 13g are held by a CCD holder 30 to be provided as a unit. The CCD holder 30 is provided with a holder body 30a, a sealing member 30b and a pressure plate 30c. The third lens group 13e is held by the holder body 30a at a front end aperture thereof. The low-pass filter 13f is held between a flange formed on an inner surface of the holder body 30a and the sealing member 30b, and the CCD 13g is held between the sealing member 30b and the pressure plate 30c. The holder body 30a and the pressure plate 30c are fixed to each other by three fixing screws 30d (see FIGS. 15 and 18) separately arranged around the central axis of the CCD holder 30 (the photographing optical axis Z1 in a photographic state of the zoom lens 10). The three fixing screws 30d also secure one end portion of an image transmission flexible PWB 31 to the rear surface of the pressure plate 30c so that a supporting substrate of the CCD 13g is electrically connected to the image transmission flexible PWB 31.

The image transmission flexible PWB 31 extends from its connection end at the CCD 13g to the retraction space SP in the housing 11. The image transmission flexible PWB 31 is provided with a first linear portion (free-deformable portion/first flat portion) 31a, a U-shaped portion (free-deformable portion) 31b, a second linear portion (free-deformable portion/second flat portion) 31c, and a third linear portion (fixed portion) 31d (see FIGS. 1 and 2). The first linear portion 31a is substantially orthogonal to the photographing optical axis Z1 and extends upward. The U-shaped portion 31b is bent forward from the first linear portion 31a. The second linear portion 31c extends downward from the U-shaped portion 31b. The third linear portion 31d is folded upward from the second linear portion 31c. The third linear portion 31d is fixed to an inner surface of the front wall 15a of the housing 11 therealong. The first linear portion 31a, the U-shaped portion 31b and the second linear portion 31c (except the third linear portion 31d) serve as a free-deformable portion which is freely resiliently deformable according to the motion of the CCD holder 30. Although not shown in the drawings, an end strip portion of the image transmission flexible PWB 31 which extends from the upper end of the third linear portion 31d is extended to the outside of the housing 11 to be connected to the aforementioned image processing circuit (see FIG. 5) that is provided as a part of the control circuit 14a.

The CCD holder 30 is supported by a horizontal moving frame (an element of an image stabilizing mechanism) 32 via three adjusting screws 33 (see FIGS. 15 and 18) separately arranged around the central axis of the CCD holder 30 (the photographing optical axis Z1 in a ready-photograph state of the zoom lens 10). Three compression coil springs 34 are installed between the CCD holder 30 and the horizontal moving frame 32. The shaft portions of the three adjusting screws 33 are inserted into the three compression coil springs 34, respectively. When the tightening amounts of the adjusting screws 33 are changed, the respective compression amounts of the coil springs 34 are changed. The adjusting screws 33 and the compression coil springs 34 are provided at three different positions around the optical axis of the third lens group 13e, and accordingly, the inclination of the CCD holder 30 with respect to the horizontal moving frame 32, or the inclination of the optical axis of the third lens group 13e with respect to the photographing optical axis Z1, can be adjusted by changing the tightening amounts of the three adjusting screws 33.

Figure 16:
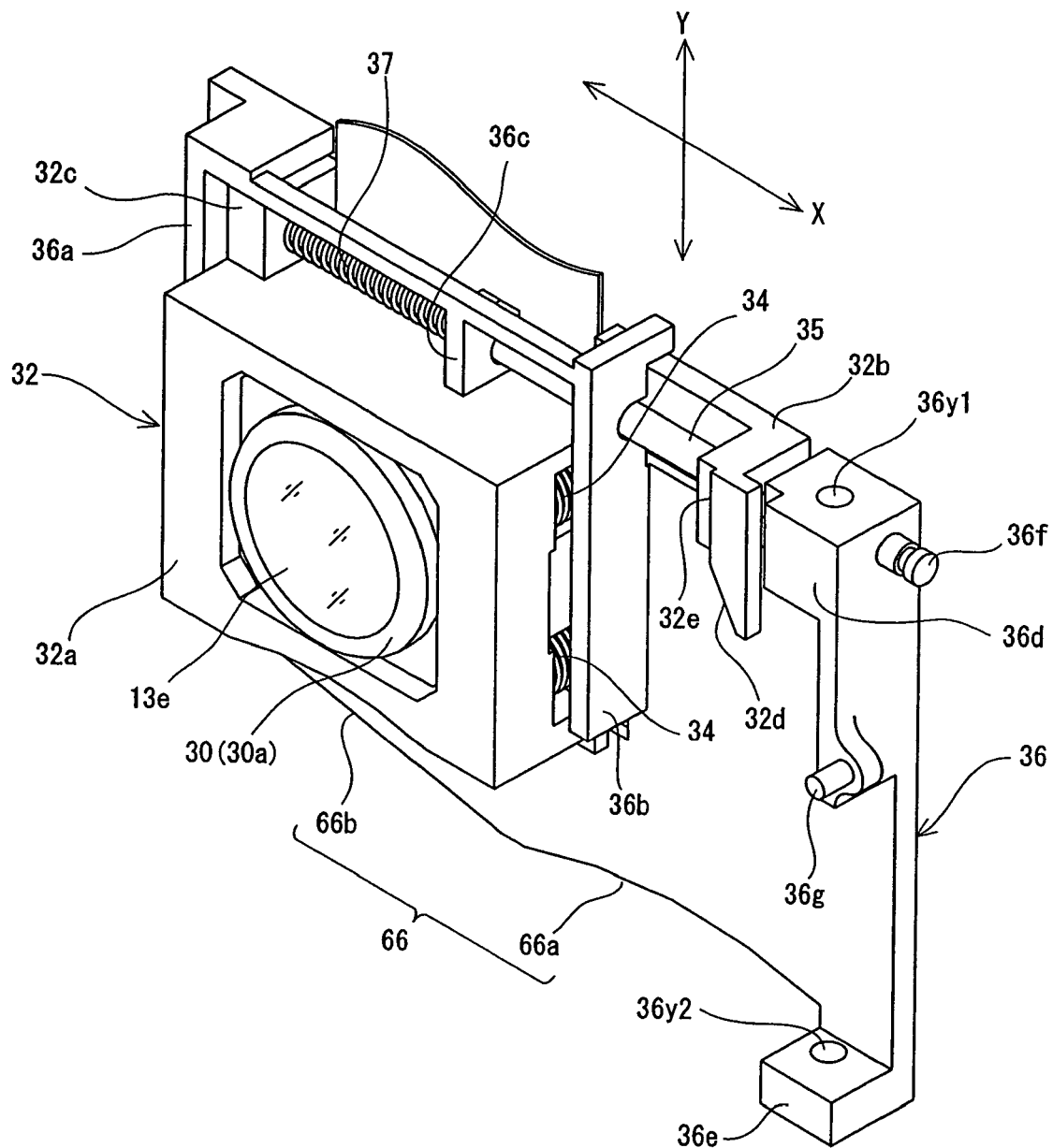
FIG. 16 is a front perspective view of a horizontal moving frame and a vertical moving frame which support the CCD holder, and associated elements.
Figure 17:
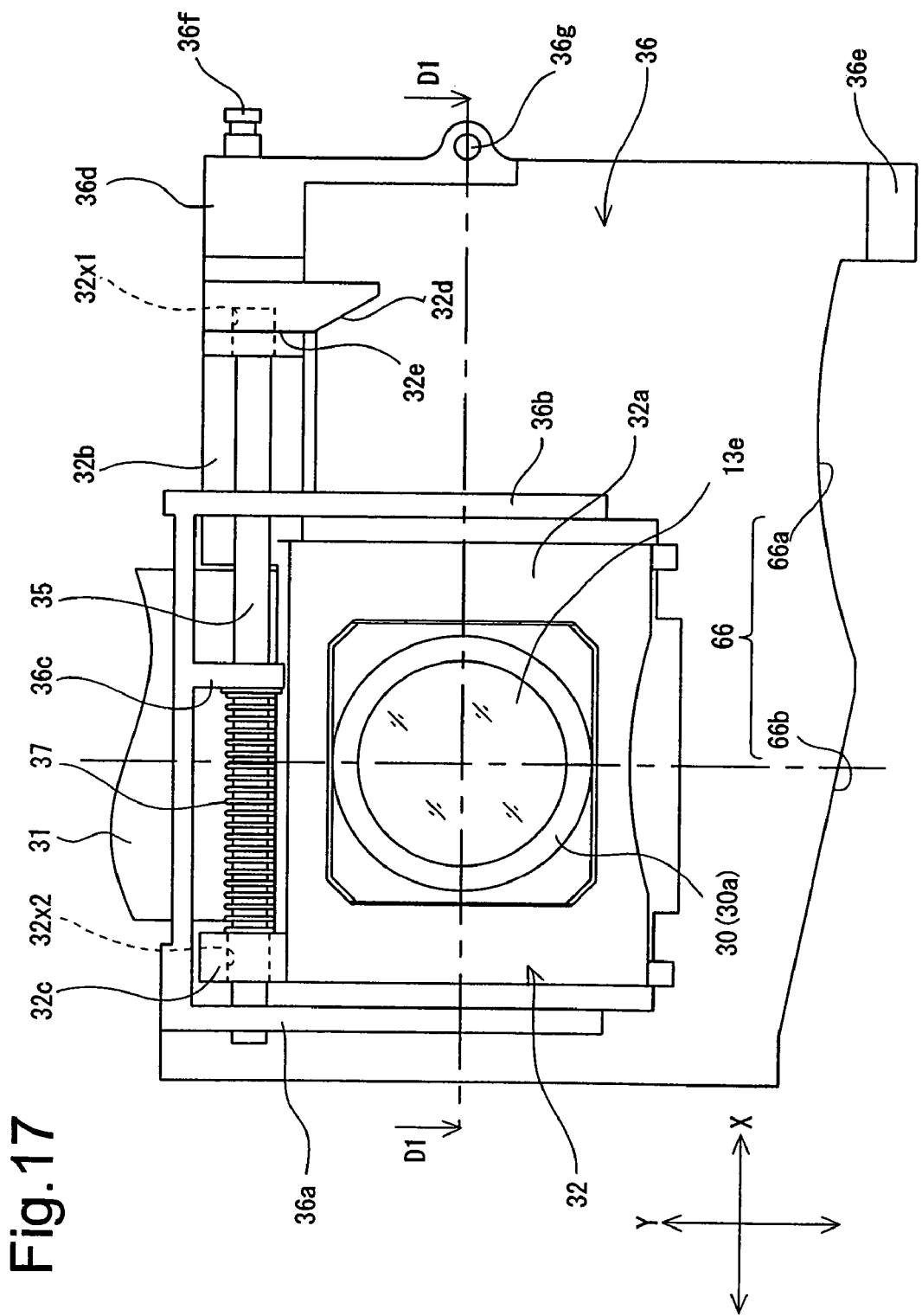
FIG. 17 is a front view of the horizontal moving frame, the vertical moving frame and the associated elements shown in FIG. 16.

As shown in FIG. 16, the horizontal moving frame 32 is supported by a vertical moving frame (an element of a radially-retracting device/an element of the image stabilizer) 36 to be movable with respect thereto via a horizontal guide shaft 35 extending in the x-axis direction. Specifically, the horizontal moving frame 32 is provided with a rectangular frame portion 32a which encloses the CCD holder 30 and an arm portion 32b which extends horizontally from the frame portion 32a. A spring supporting protrusion 32c is formed on an upper surface of the frame portion 32a, and an inclined surface 32d and a position restricting surface 32e are formed on an end portion of the arm portion 32b. The position restricting surface 32e is a flat surface parallel to the y-axis. On the other hand, the vertical moving frame 36 is provided with a pair of motion restricting frames 36a and 36b, a spring supporting portion 36c, an upper bearing portion 36d, and a lower bearing portion 36e. The pair of motion restricting frames 36a and 36b are provided spaced apart in the x-axis direction. The spring supporting portion 36c is located between the pair of the motion restricting frames 36a and 36b. The upper bearing portion 36d is located on a line extended from the spring supporting portion 36c in the x-axis direction. The lower bearing portion 36e is located below the upper bearing portion 36d. As shown in FIG. 17, the horizontal moving frame 32 is supported by the vertical moving frame 36 in a state where the frame portion 32a is positioned in the space between the pair of motion restricting frames 36a and 36b and where the inclined surface 32d and the position restricting surface 32e of the arm portion 32b are positioned between the motion restricting frame 36b and the upper bearing portion 36d.

One end of the horizontal guide shaft 35 is fixed to the motion restricting frame 36a of the vertical moving frame 36, and the other end of the horizontal guide shaft 35 is fixed to the upper bearing portion 36d of the vertical moving frame 36. Two through-holes are respectively formed in the motion restricting frame 36b and the spring supporting portion 36c to be horizontally aligned to each other so as to allow the horizontal guide shaft 35 to pass through the motion restricting frame 36b and the spring supporting portion 36c. Horizontal through-holes 32x1 and 32x2 (see FIG. 17) into which the horizontal guide shaft 35 is inserted are formed in the arm portion 32b and the spring supporting protrusion 32c of the horizontal moving frame 32, respectively. The horizontal through-holes 32x1 and 32x2 of the horizontal moving frame 32 and the aforementioned two through-holes which are respectively formed in the motion restricting frame 36b and the spring supporting portion 36c are horizontally aligned with each other. Since the horizontal guide shaft 35 is slidably fitted in the horizontal through-holes 32x1 and 32x2, the horizontal moving frame 32 is supported by the vertical moving frame 36 to be movable with respect to the vertical moving frame 36 in the x-axis direction. A horizontal moving frame biasing spring 37 is installed on the horizontal guide shaft 35 between the spring supporting protrusion 32c and the spring supporting portion 36c. The horizontal moving frame biasing spring 37 is a compression coil spring and biases the horizontal moving frame 32 in a direction (leftward as viewed in FIG. 17) to make the spring supporting protrusion 32c approach the motion restricting frame 36a.

Vertical through-holes 36y1 and 36y2 (see FIG. 16) are further formed in the upper bearing portion 36d and the lower bearing portion 36e of the vertical moving frame 36, respectively, which extend in a line along the y-axis direction which is orthogonal to the photographing optical axis Z1. The vertical through-hole 36y1 and the vertical through-hole 36y2 are vertically aligned, and a vertical guide shaft (an element of the radially-retracting device/an element of the image stabilizer) 38 (see FIGS. 8 and 9) passes through vertical through-hole 36y1 and the vertical through-hole 36y2. Both ends of the vertical guide shaft 38 are fixed to the housing 11, and therefore, the vertical moving frame 36 can move along the vertical guide shaft 38 in the y-axis direction inside the camera. More specifically, the vertical moving frame 36 can move between the photographing position shown in FIG. 1 and the retracted position shown in FIG. 2. When the vertical moving frame 36 is positioned in the photographing position as shown in FIG. 2, the centers of the third lens group 13e, the low-pass filter 13f and the CCD 13g in the CCD holder 30 are positioned on the photographing optical axis Z1. When the vertical moving frame 36 is positioned in the radially retracted position as shown in FIG. 1, the centers of the third lens group 13e, the low-pass filter 13f and the CCD 13g are positioned in the off-optical-axis retracted position Z2 that is located above the fixed ring portion 16.

The vertical moving frame 36 is provided with a spring hooking portion 36f which projects horizontally from a side surface of the vertical moving frame 36 in a direction away from the vertical through-hole 36y1, and a vertical moving frame biasing spring 39 is extended between the spring hooking portion 36f and a spring hooking portion 11a (see FIGS. 8 and 15) fixed to the housing 11 therein. The vertical moving frame biasing spring 39 is an extension coil spring and biases the vertical moving frame 36 downward (i.e., toward the photographing position thereof shown in FIG. 2).

As described above, the horizontal moving frame 32 that holds the CCD holder 30 is supported by the vertical moving frame 36 to be movable in the x-axis direction with respect to the vertical moving frame 36, and the vertical moving frame 36 is supported by the housing 11 via the vertical guide shaft 38 to be movable in the y-axis direction with respect to the housing 11. Image shake can be counteracted by moving the CCD holder 30 in the x-axis direction and the y-axis direction. To this end, a horizontal driving lever (an element of the image stabilizer) 40 and a vertical driving lever (an element of the image stabilizer) 41 are provided as elements of a driving mechanism which achieves such movement of the CCD holder 30. The horizontal driving lever 40 and the vertical driving lever 41 are pivoted on a lever pivot shaft 42 to be rotatable (swingable) independently of each other. The lever pivot shaft 42 is positioned in the housing 11 and fixed thereto to be parallel to the photographing optical axis Z1.

Figure 9:
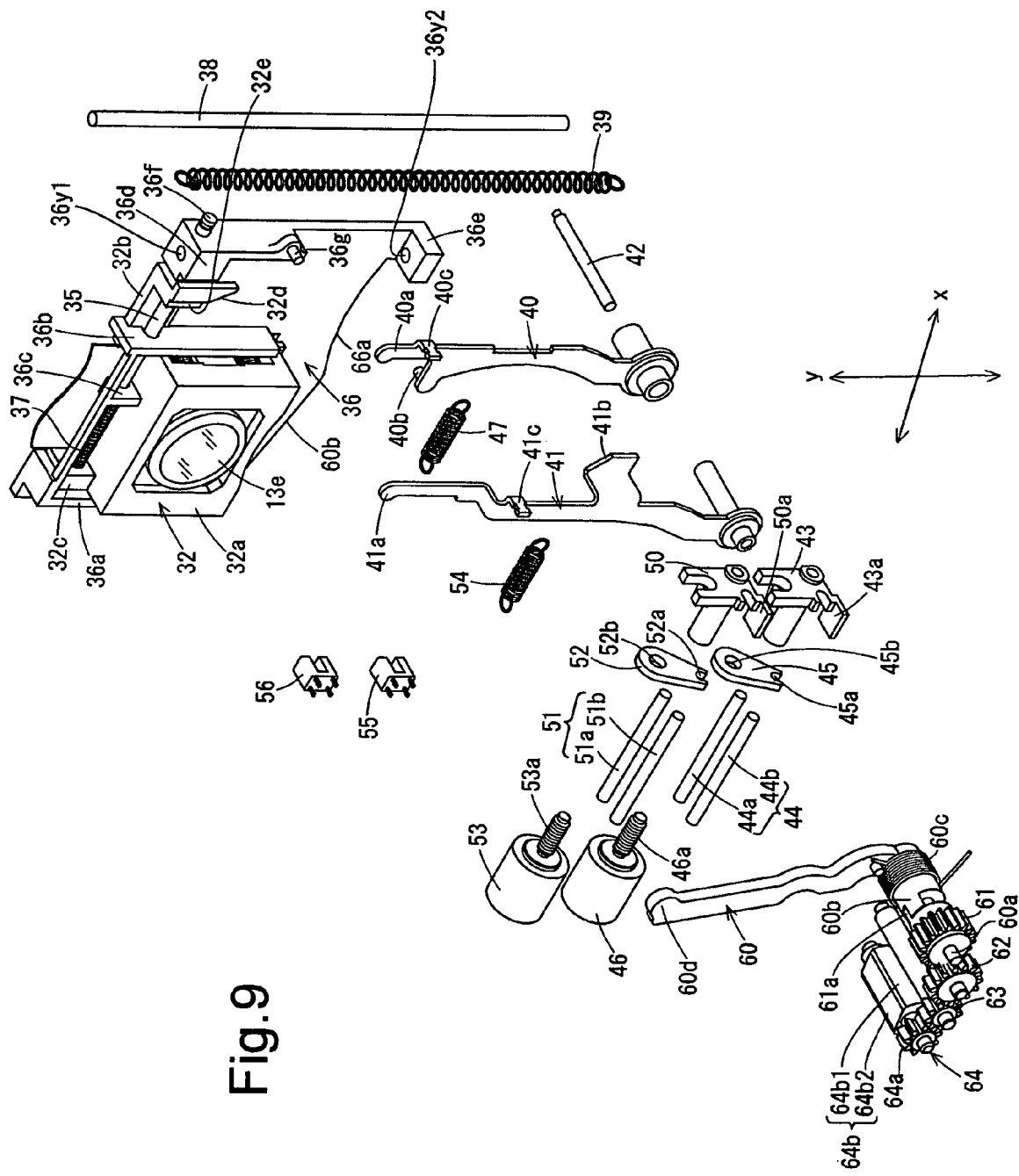
FIG. 9 is an exploded perspective view of elements of an image stabilizing mechanism and a radially-retracting mechanism which are shown in FIG. 8.
Figure 12:
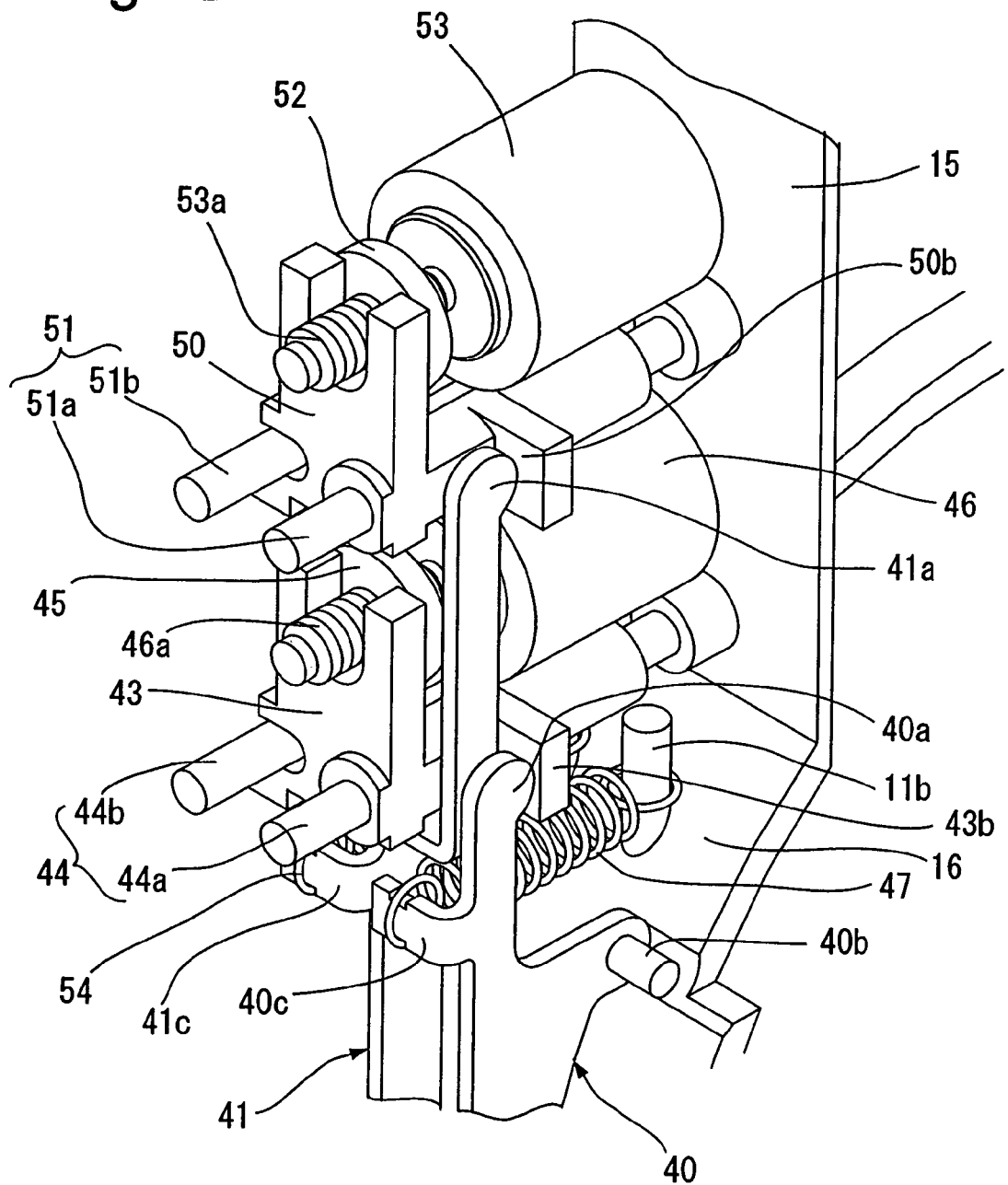
FIG. 12 is a rear perspective view of a portion of the image stabilizing mechanism as viewed from the rear side of FIGS. 10 and 11.
Figure 13:
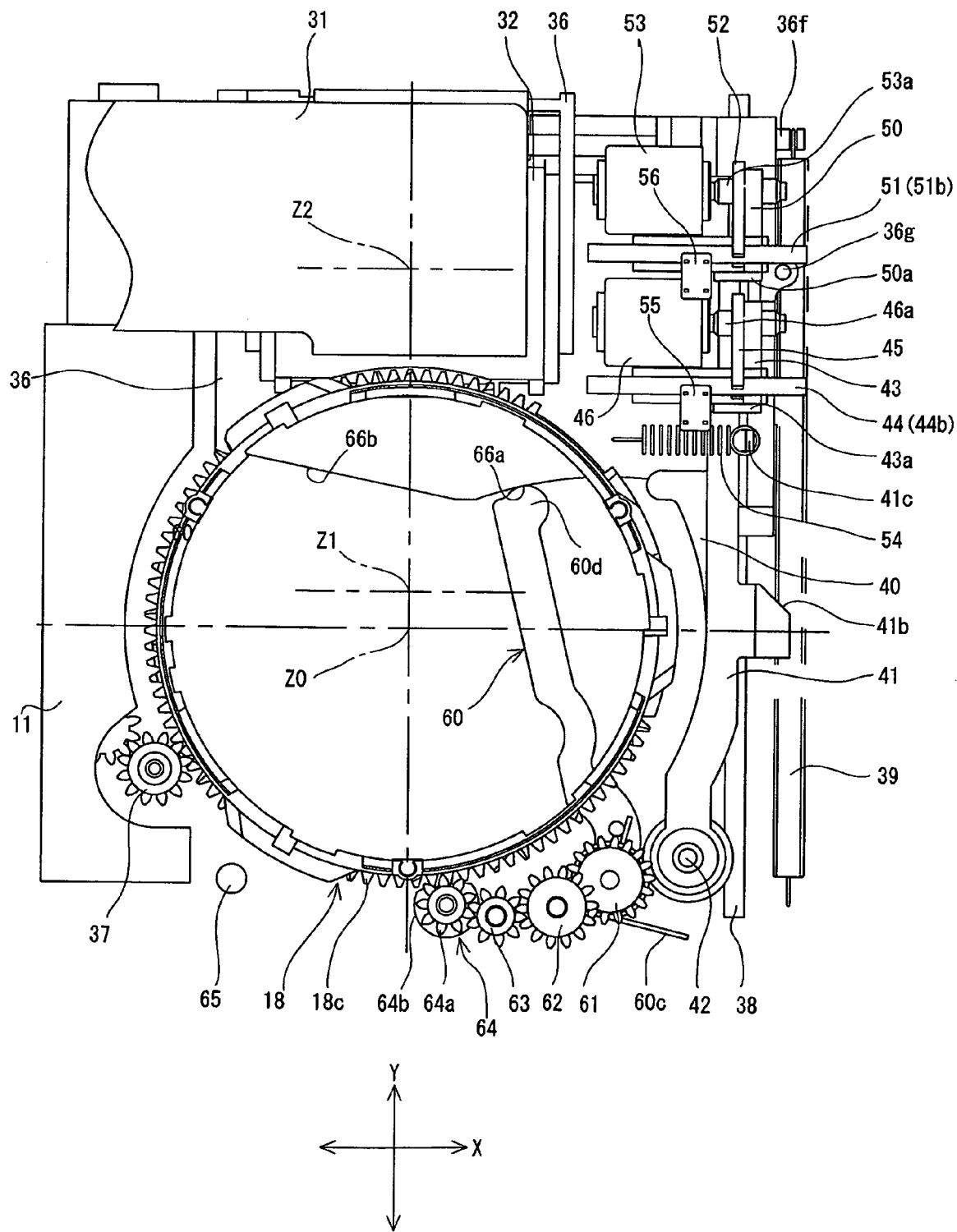
FIG. 13 is a front elevational view of the image stabilizing mechanism and the radially-retracting mechanism in the state shown in FIG. 10, as viewed from the front in the optical axis direction.
Figure 14:
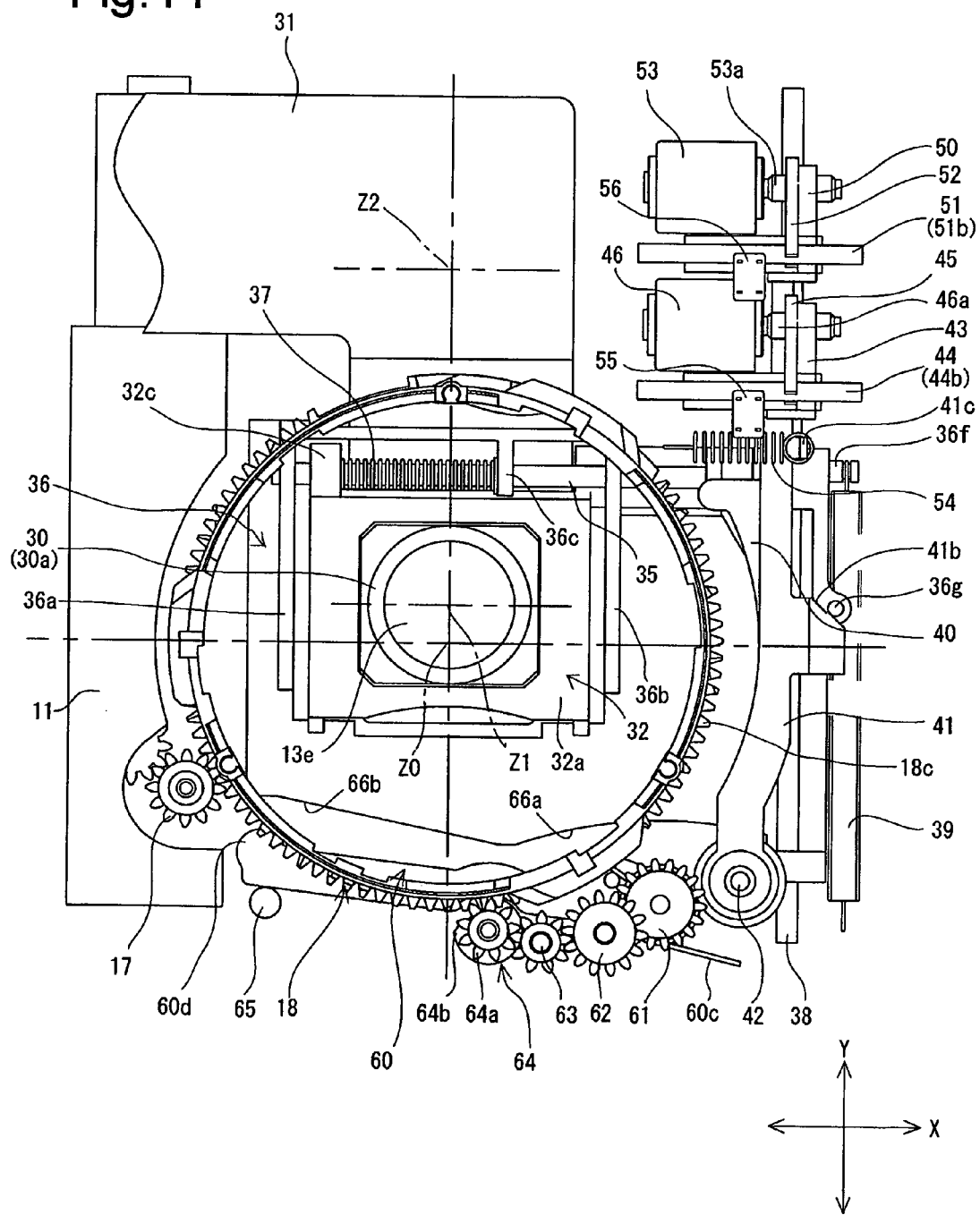
FIG. 14 is a front elevational view of the image stabilizing mechanism and the radially-retracting mechanism in the state shown in FIG. 11, as viewed from the front in the optical axis direction.
Figure 20:
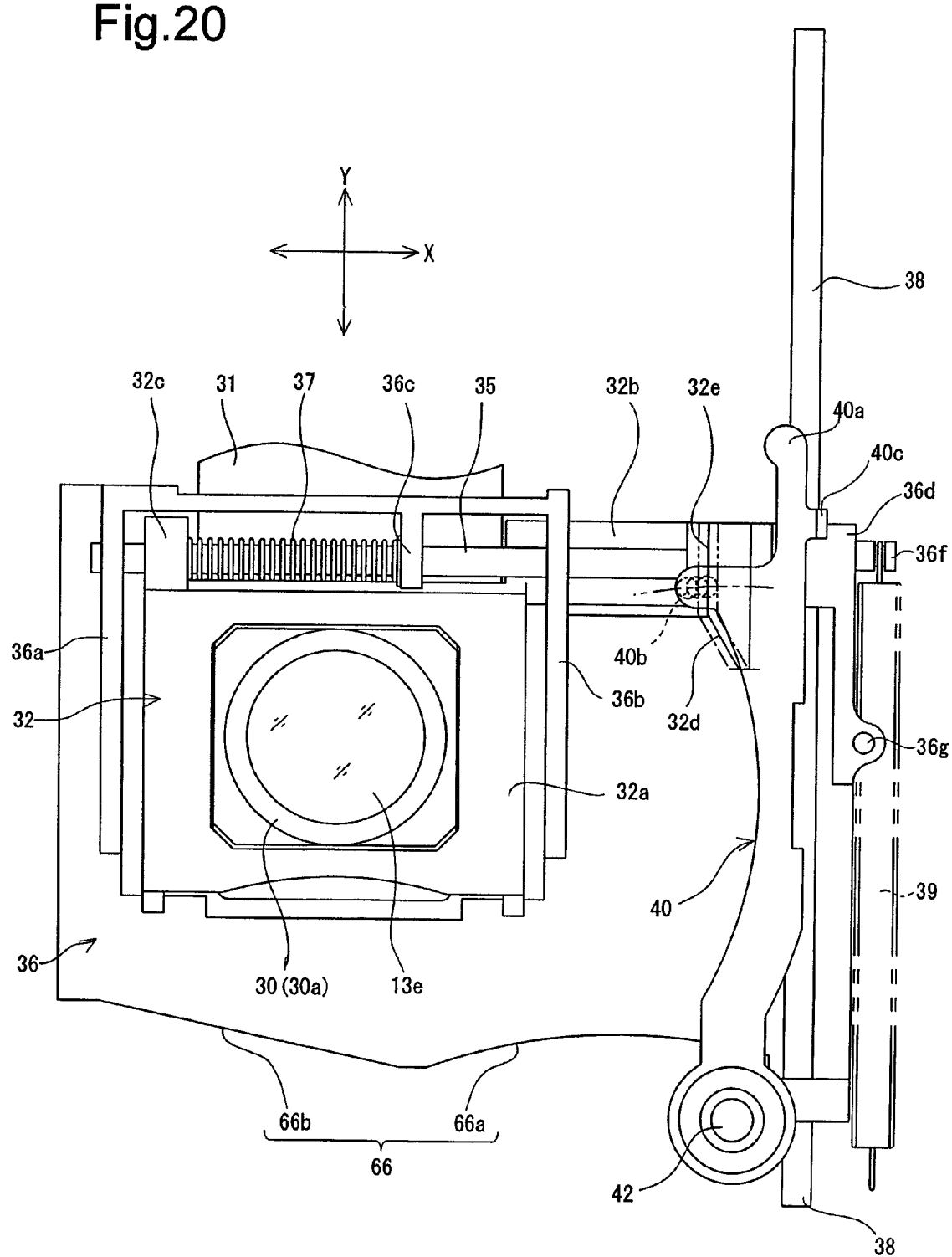
FIG. 20 is a front elevational view of the elements shown in FIGS. 16 through 17 and other associated elements, illustrating an image stabilizing action in the horizontal direction by an operation of a horizontal driving lever.

As shown in FIGS. 9 and 20, the horizontal driving lever 40 is pivoted at the lower end thereof on the lever pivot shaft 42, and is provided at the upper end of the horizontal driving lever 40 with a force-applying end 40*a*. The horizontal driving lever 40 is provided in the vicinity of the force-applying end 40*a* with an operation pin 40*b* which projects rearward in the optical axis direction and a spring hooking portion 40*c* which projects forward in the optical axis direction. As shown in FIG. 12, the force-applying end 40*a* of the horizontal driving lever 40 abuts against a lug 43*b* of a first moving member (an element of the image stabilizer) 43. The first moving member 43 is supported by a pair of parallel guide bars 44 (44*a* and 44*b*) to be slidable thereon in the x-axis direction, and a driven nut member 45 abuts against the first moving member 43. The driven nut member 45 is provided with a female screw hole 45*b* and a rotation restricting groove 45*a* (see FIG. 9) which is slidably fitted on the guide bar 44*b*. A drive shaft (a feed screw) 46*a* of a first stepping motor (an element of the image stabilizer) 46 is screwed into the female screw hole 45*b*. As shown in FIGS. 13 and 14, the driven nut member 45 abuts against the first moving member 43 from the left side. One end of an extension coil spring 47 is hooked on the spring hooking portion 40*c* of the horizontal driving lever 40, and the other end of the spring 47 is hooked on a spring hooking portion 11*b* which projects from an inner surface of the housing 11 (see FIG. 12). The extension coil spring 47 biases the horizontal driving lever 40 in a direction to bring the first moving member 43 to abut against the driven nut member 45, i.e., in a counterclockwise direction as viewed in FIGS. 13, 14 and 20. Due to this structure, driving the first stepping motor 46 causes the driven nut member 45 to move along the pair of guide bars 44, and at the same time causes the first moving member 43 to move together with the driven nut member 45, thus causing the horizontal driving lever 40 to swing about the lever pivot shaft 42. Specifically, moving the driven nut member 45 rightward as viewed in FIGS. 13 and 14 causes the driven nut member 45 to press the first moving member 43 in the same direction against the biasing force of the extension spring 47, thus causing the horizontal driving lever 40 to rotate clockwise as viewed in FIGS. 13 and 14. Conversely, moving the driven nut member 45 leftward as viewed in FIGS. 13 and 14 causes the first moving member 43 to move in the same direction while following the leftward movement of the driven nut member 45 due to the biasing force of the extension coil spring 47, thus causing the horizontal driving lever 40 to rotate counterclockwise as viewed in FIGS. 13 and 14.

As shown in FIG. 20, the operation pin 40*b* of the horizontal driving lever 40 abuts against the position restricting surface 32*e* that is provided on the end portion of the arm portion 32*b* of the horizontal moving frame 32. Since the horizontal moving frame 32 is biased leftward as viewed in FIG. 20 by the horizontal moving frame biasing spring 37, the operation pin 40*b* remains in contact with the position restricting surface 32*e*. When the horizontal driving lever 40 swings, the position of the operation pin 40*b* changes along the x-axis direction, so that the horizontal moving frame 32 moves along the horizontal guide shaft 35. Specifically, rotating the horizontal driving lever 40 clockwise as viewed in FIG. 20 causes the operation pin 40*b* to press the position restricting surface 32*e*, which causes the horizontal moving frame 32 to move rightward as viewed in FIG. 20 against the biasing force of the horizontal moving frame biasing spring 37. Conversely, rotating the horizontal driving lever 40 counterclockwise as viewed in FIG. 20 causes the operation pin 40*b* to move in a direction away from the position restricting surface 32*e* (leftward as viewed in FIG. 20), which causes the horizontal moving frame 32 to move in the same direction while following the leftward movement of the operation pin 40*b* due to the biasing force of the horizontal moving frame biasing spring 37.

Figure 21:
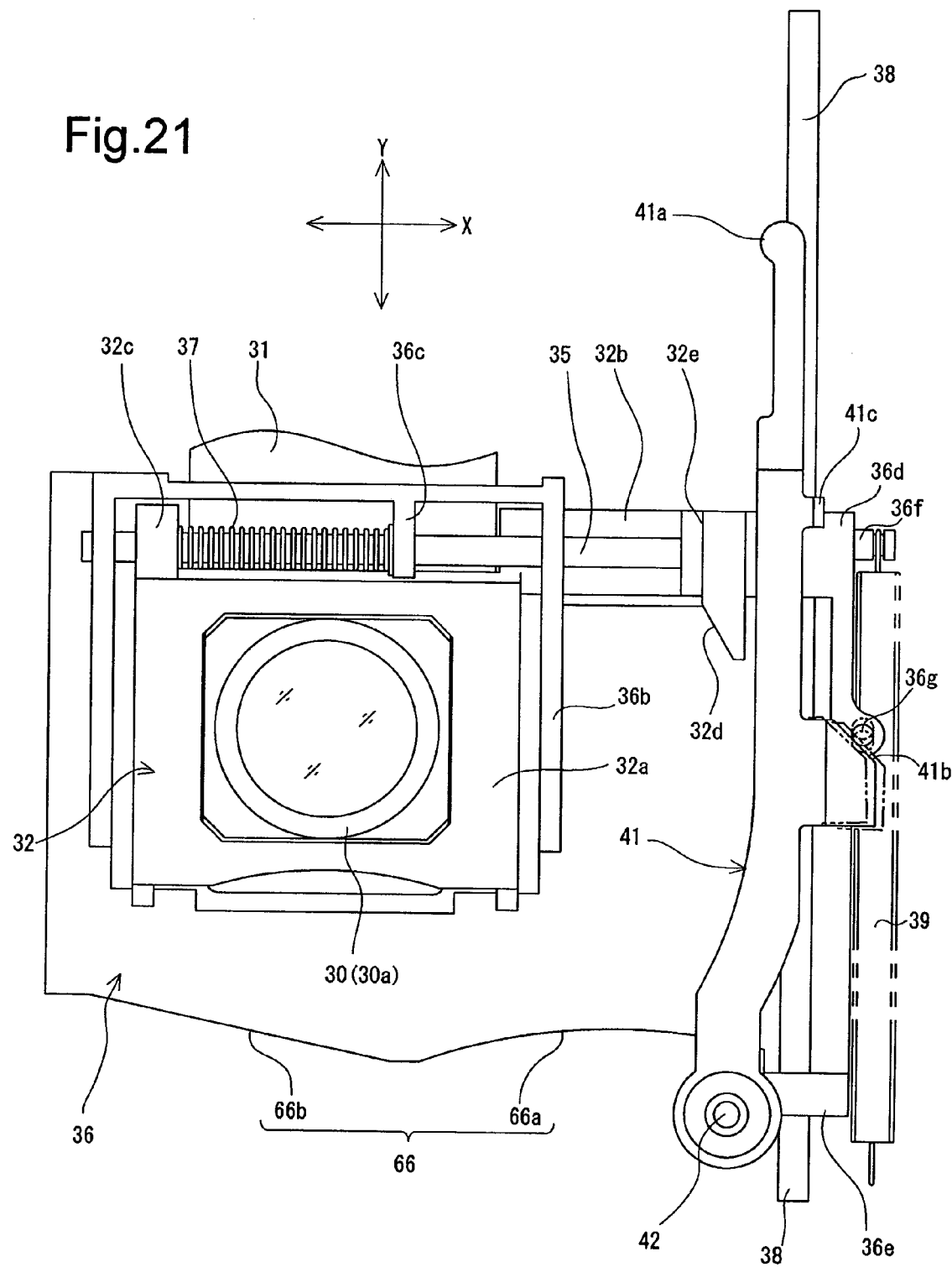
FIG. 21 is a front elevational view of the elements shown in FIG. 20, illustrating an image stabilizing action in the vertical direction by an operation of a vertical driving lever.

As shown in FIGS. 9 and 21, the vertical driving lever 41 is pivoted at its lower end on the lever pivot shaft 42, as in the case of the horizontal driving lever 40, and is provided at the upper end of the vertical driving lever 41 with a force-applying end 41*a*. The vertical driving lever 41 is longer than the horizontal driving lever 40, and the force-applying end 41*a* protrudes upward to a position higher than the position of the force-applying end 40*a*. The vertical driving lever 41 is provided between the lever rotating shaft 42 and the force-applying end 41*a* with a pressing inclined surface 41*b* which projects rightward as viewed in FIG. 21. The vertical driving lever 41 is provided above the pressing inclined surface 41*b* with a spring hooking portion 41*c*. As shown in FIG. 12, the force-applying end 41*a* abuts against a lug 50*b* of a second moving member (an element of the image stabilizer) 50. The second moving member 50 is supported by a pair of parallel guide bars 51 (51*a* and 51*b*) to be slidable thereon in the x-axis direction, and a driven nut member 52 abuts against the second moving member 50. The driven nut member 52 is provided with a female screw hole 52*b* and a rotation restricting groove 52*a* which is slidably fitted on the guide bar 51*b*. A drive shaft (a feed screw) 53*a* of a second stepping motor (an element of the image stabilizer) 53 is screwed into the female screw hole 52*b*. As shown in FIGS. 13 and 14, the driven nut member 52 abuts against the second moving member 50 from the left side as viewed from the front of the camera. One end of an extension coil spring 54 is hooked on the spring hooking portion 41*c* of the vertical driving lever 41, and the other end of the spring 54 is hooked on a spring hooking portion (not shown) formed on an inner surface of the housing 11. The extension coil spring 54 biases the vertical driving lever 41 in a direction to bring the second moving member 50 to abut against the driven nut member 52, i.e., in the counterclockwise direction as viewed in FIGS. 13, 14, and 21. Due to this structure, driving the second stepping motor 53 causes the driven nut member 52 to move along the pair of guide bars 51, and at the same time causes the second moving member 50 to move together with the driven nut member 52, thus causing the vertical driving lever 41 to swing about the lever pivot shaft 42. Specifically, moving the driven nut member 52 rightward as viewed in FIGS. 13 and 14 causes the driven nut member 52 to press the second moving member 50 in the same direction against the biasing force of the extension spring 54, thus causing the vertical driving lever 41 to rotate clockwise as viewed in FIGS. 13 and 14. Conversely, moving the driven nut member 52 leftward as viewed in FIGS. 13 and 14 causes the second moving member 50 to move in the same direction while following the leftward movement of the driven nut member 52 due to the biasing force of the extension spring 54, thus causing the vertical driving lever 41 to rotate counterclockwise as viewed in FIGS. 13 and 14.

As shown in FIG. 21, the pressing inclined surface 41*b* of the vertical driving lever 41 can come into contact with a pressed pin 36*g* which projects forward from the upper bearing portion 36*d* of the vertical moving frame 36. Since the vertical moving frame 36 is biased downwards as viewed in FIG. 21 by the vertical moving frame biasing spring 39, the pressed pin 36g always remains in contact with the pressing inclined surface 41b. When the vertical driving lever 41 swings, the abutting angle of the pressing inclined surface 41b relative to the pressed pin 36g changes, so that the vertical moving frame 36 moves along the vertical guide shaft 38. Specifically, rotating the vertical driving lever 41 clockwise as viewed in FIG. 21 causes the pressing inclined surface 41b to press the pressed pin 36g upward as viewed in FIG. 21, which causes the vertical moving frame 36 to move upward against the biasing force of the vertical moving frame biasing spring 39. Conversely, rotating the vertical driving lever 41 counterclockwise as viewed in FIG. 21 causes the abutting point on the pressing inclined surface 41b relative to the pressed pin 36g to descend, which causes the vertical moving frame 36 to move downward by the biasing force of the vertical moving frame biasing spring 39.

In the above-described structure, the horizontal moving frame 32 can be caused to move left or right in the x-axis direction by driving the first stepping motor 46 forward or reverse. Furthermore, the vertical moving frame 36 can be caused to move upwards or downwards in the y-axis direction by driving the second stepping motor 53 forward or reverse.

The first moving member 43 is provided with a plate portion 43a, and the second moving member 50 is provided with a plate portion 50a. The initial position of the horizontal moving frame 32 can be detected by a photo sensor 55 having a light emitter and a light receiver which are spaced apart from each other as shown in FIGS. 8, 10 and 11 when the plate portion 43a passes between the light emitter and the light receiver of the photo sensor 55. The plate portion 43a and the photo sensor 55 constitute a photo interrupter. Likewise, the initial position of vertical moving frame 36 can be detected by a photo sensor 56 having a light emitter and a light receiver which are spaced apart from each other as shown in FIGS. 8, 10 and 11 when the plate portion 50a passes between the light emitter and the light receiver of the photo sensor 56. The plate portion 50a and the photo sensor 56 constitute a photo interrupter. The two photo sensors 55 and 56 are fixed in two fixing holes 15a1 and 15a2 (see FIG. 8) formed on a front wall of the housing 11 to be supported thereby.

The present embodiment of the zoom lens camera has an image-shake detection sensor 57 (see FIG. 5) which detects the angular velocity around two axes (the vertical and horizontal axes of the camera) orthogonal to each other in a plane perpendicular to the photographing optical axis Z1. The magnitude and the direction of camera shake (vibrations) are detected by the image-shake detection sensor 57. The control circuit 14a determines a moving angle by time-integrating the angular velocity of the camera shake in the two axial directions, detected by the image-shake detection sensor 57. Subsequently, the control circuit 14a calculates from the moving angle the moving amounts of the image on a focal plane (imaging surface/light receiving surface of the CCD 13g) in the x-axis direction and in the y-axis direction. The control circuit 14 further calculates the driving amounts and the driving directions of the horizontal moving frame 32 and the vertical moving frame 36 for the respective axial directions (driving pulses for the first stepping motor 46 and the second stepping motor 53) in order to counteract the camera shake. Thereupon, the first stepping motor 46 and the second stepping motor 53 are actuated and the operations thereof are controlled in accordance with the calculated values. In this manner, each of the horizontal moving frame 32 and the vertical moving frame 36 is driven in the calculated direction by the calculated amount in order to counteract the shake of the photographing optical axis Z1 to thereby stabilize the image on the focal plane. The camera can be put into this image stabilization mode by turning on a photographing mode select switch 14e (see FIG. 5). If the switch 14e is in an off-state, the image stabilizing capability is deactivated so that a normal photographing operation is performed.

Figure 22:
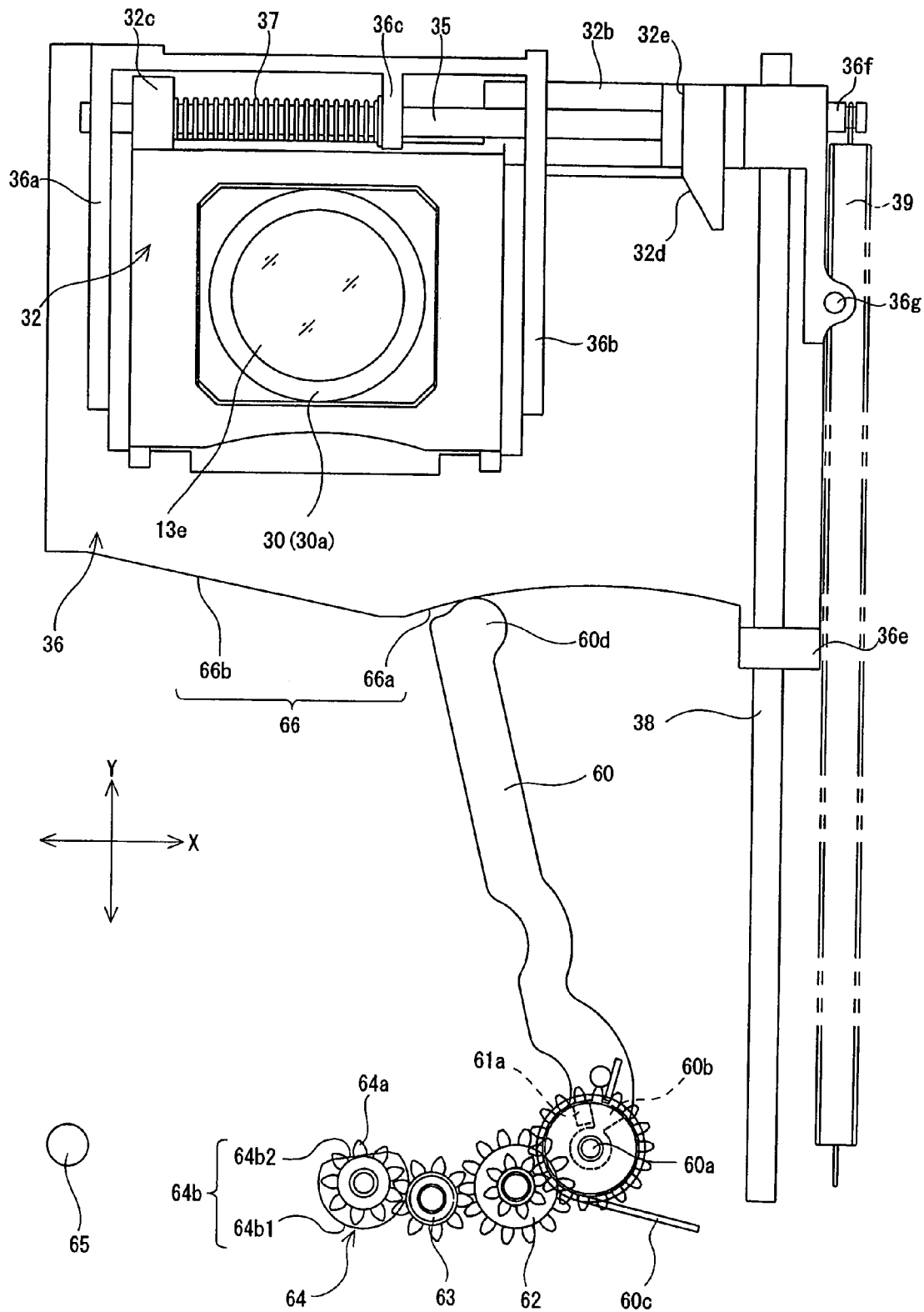
FIG. 22 is a front elevational view of elements of the image stabilizing mechanism and the radially-retracting mechanism, illustrating the retracted state of the CCD holder, the horizontal moving frame and the vertical moving frame which are retracted by an operation of a retracting lever.
Figure 23:
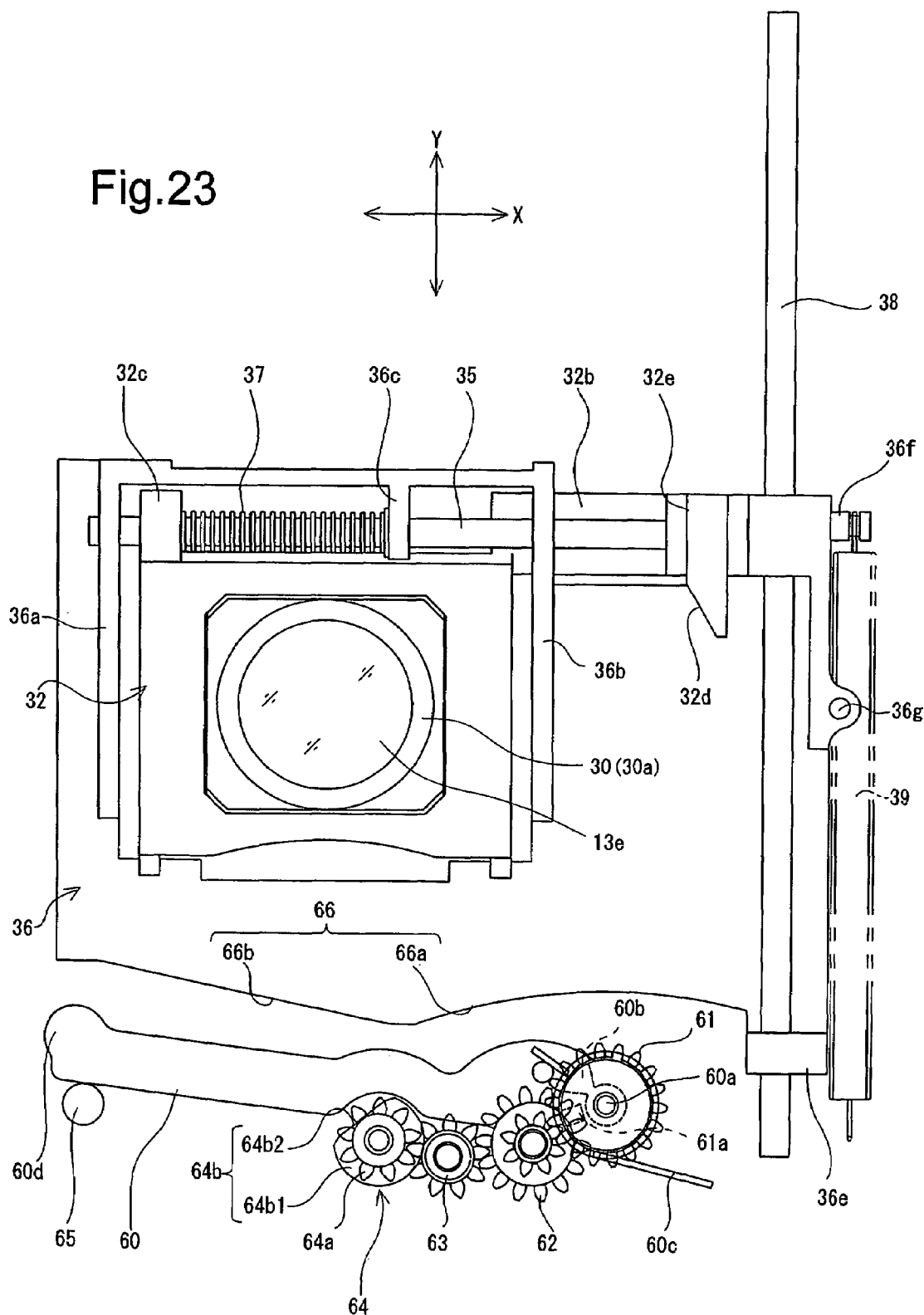
FIG. 23 is a front elevational view of the elements shown in FIG. 22, illustrating a state in which the CCD holder, the horizontal moving frame and the vertical moving frame return to their respective photographing positions where the CCD holder is positioned on the photographing optical axis when the retracting lever is disengaged from the vertical moving frame to stop upholding the vertical moving frame.

The present embodiment of the zoom lens camera uses part of the above-described image stabilizing mechanism to perform the retracting operation (radially retracting operation) of the third lens group 13e, the low-pass filter 13f and the CCD 13g toward the off-optical-axis retracted position Z2 into the retraction space SP when the zoom lens 10 is retracted from a photographic state. As shown in FIGS. 22 and 23, a retracting lever (an element of the radially-retracting device) 60 is provided below the vertical moving frame 36. The retracting lever 60 is pivoted on a pivot shaft 60a to be rotatable (swingable) thereabout. A coaxial gear 61 is installed adjacent to the retracting lever 60, and is coaxially provided on the pivot shaft 60a to be rotatable on the pivot shaft 60a. A rotational force is transferred from an interconnecting gear 64 to the coaxial gear 61 via two relay gears 62 and 63. The pivot shaft 60a, which serves as the rotation axis of each of the retracting lever 60 and the coaxial gear 61, the rotation axes of the relay gears 62 and 63, and the rotation axis of the interconnecting gear 64 are each parallel to the rotation center axis Z0 (and the photographing optical axis Z1).

As shown in FIGS. 9, 22 and 23, the retracting lever 60 is provided in the vicinity of the pivot shaft 60a with a rotation transfer protrusion 60b having a sector-shaped cross section and projecting forward in the optical axis direction. The coaxial gear 61 is provided, at a rear end thereof, with a rotation transfer protrusion 61a which projects rearward in the optical axis direction, has the same diameter of that of the rotation transfer protrusion 60b, and is coaxial with the rotational shaft 60a. Namely, the rotation transfer protrusion 60b and the rotation transfer protrusion 61a have the same diameter and are positioned on the pivot shaft 60a to be circumferentially engageable with each other. The coaxial gear 61 transfers a rotation thereof to the retracting lever 60 by engaging the rotation transfer protrusion 61a with the rotation transfer protrusion 60b of the retracting lever 60. When the coaxial gear 61 rotates in a direction to disengage the rotation transfer protrusion 61a from the rotation transfer protrusion 60b, the rotational force of the coaxial gear 61 is not transferred to the retracting lever 60. The retracting lever 60 is biased to rotate counterclockwise as viewed in FIGS. 22 and 23 by a torsion spring 60c, and the housing 11 is provided therein with a stop projection 65 (see FIGS. 13, 14, 22 and 23) which defines the limit of rotation of the retracting lever 60 in the biasing direction of the torsion spring 60c. Namely, the retracting lever 60 comes in contact with the stop projection 65 as shown in FIG. 23 when fully rotated counterclockwise as viewed in FIGS. 22 and 23.

The vertical moving frame 36 is provided on a bottom surface thereof with an abutment surface 66 consisting of an arc-shaped surface 66a and a leading surface 66b. The arc-shaped surface 66a has an arc shape which corresponds to an arc pivoted on the axis of the pivot shaft 60a of the retracting lever 60, and the leading surface 66b is formed as a flat inclined surface. The lowermost point of the leading surface 66b is located at the portion thereof which is connected to the arc-shaped surface 66a, and the leading surface 66b gradually rises in a direction away from the arc-shaped surface 66a (in a direction to approach the left side surface of the vertical moving frame 36 as viewed in FIGS. 22 and 23).

The interconnecting gear 64 is provided with a gear portion 64a and a rotation restricting portion 64b at different positions in the axial direction of interconnecting gear 64. The rotation restricting portion 64b has a non-circular (D-shaped)

cross-sectional shape and includes a large-diameter cylindrical portion 64b1 and a flat portion 64b2. The large-diameter cylindrical portion 64b1 has an incomplete cylindrical shape having a diameter larger than that of the gear portion 64a. The flat portion 64b2 is formed on the rotation restricting portion 64b in a manner so that a part of the large diameter cylindrical portion 64b1 appears to be cut off to form a nearly flat shape. In an area in which the flat portion 64b2 is formed, the tips of the teeth of the gear portion 64a project radially outwards from the rotation restricting portion 64b. The flat portion 64b2 is formed as a flat surface which includes a straight line parallel to the axis of rotation of the interconnecting gear 64.

The interconnecting gear 64 is positioned to face the outer surface of the helicoid ring 18. The spur gear 18c faces either the gear portion 64a of the interconnecting gear 64 (in the state shown in FIGS. 11 and 14) or the rotation restricting portion 64b (in the state shown FIGS. 10 and 13) depending on the axial position (and the type of motion) of the helicoid ring 18 in the optical axis direction. When the helicoid ring 18 rotates at a fixed position as described above, the spur gear 18c is engaged with the gear portion 64a. As the helicoid ring 18 moves in the retracting direction from the fixed-position rotating state, the spur gear 18c is disengaged from the interconnecting gear 64 to face the rotation restricting portion 64b, so that the transfer of rotation of the helicoid ring 18 to the interconnecting gear 64 is stopped.

The operation of the retracting lever 60 will be discussed in detail hereinafter. FIG. 23 shows elements of the image stabilizing mechanism and the retracting mechanism in a state where the zoom lens 10 is set at the wide-angle extremity. In this state, the third lens group 13e, the low-pass filter 13f and the CCD 13g are positioned on the photographing optical axis Z1 (see the upper half of the zoom lens 10 shown in FIG. 2), and also the helicoid ring 18 is in a state where the helicoid ring 18 is only allowed to rotate at a fixed position in the optical axis direction (see FIG. 6) while the gear portion 64a of the interconnecting gear 64 is engaged with the spur gear 18c of the helicoid ring 18. When the helicoid ring 18 rotates in the retracting direction from the wide-angle extremity, the coaxial gear 61 rotates clockwise as viewed in FIG. 23 via the interconnecting gear 64 and the relay gears 62 and 63. As shown in FIG. 23, since the rotation transfer protrusion 61a and the rotation transfer protrusion 60b are slightly apart from each other when the zoom lens 10 is set at the wide-angle extremity, no rotational force is transferred from the coaxial gear 61 to the retracting lever 60 for a short period of time after the coaxial gear 61 starts rotating. Accordingly, the retracting lever 60 is held in the position shown in FIG. 23 where the retracting lever 60 is in contact with the stop projection 65 due to the biasing force of the torsion spring 60c. Thereafter, upon the rotation transfer protrusion 61a coming into contact with the rotation transfer protrusion 60b and pressing the rotation transfer protrusion 60b, the retracting lever 60 starts rotating clockwise with respect to FIG. 23 against the biasing force of the torsion spring 60c. In the present embodiment, the timing of the commencement of rotation of the retracting lever 60 substantially corresponds to the angular position θ2 at which the cam ring 26 starts retracting in the optical axis direction from the fixed position rotation state (see FIG. 6).

When the retracting lever 60 rotates clockwise from the angular position shown in FIG. 23, a force-applying end 60d formed at the free end of the retracting lever 60 is brought into contact with the leading surface 66b of the abutment surface 66 of the vertical moving frame 36. A further clockwise rotation of the retracting lever 60 causes the retracting lever 60 to lift the vertical moving frame 36 according to the inclined shape of the leading surface 66b, thus causing the vertical moving frame 36 to move upward in the housing 11 along the vertical guide shaft 38.

Figure 15:
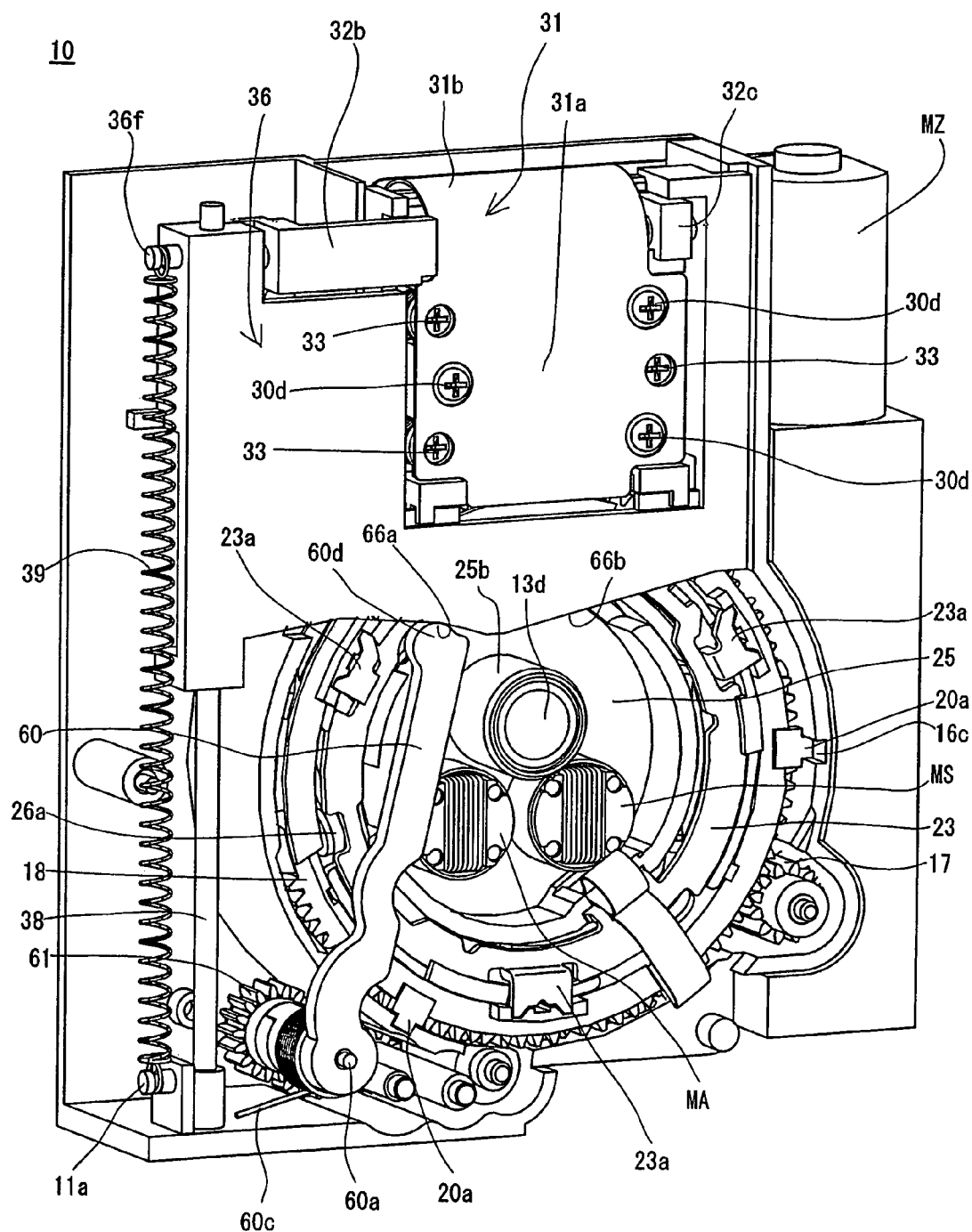
FIG. 15 is a rear perspective view of the zoom lens in the retracted state of the zoom lens shown in FIG. 1.

On and after the angular position exceeding θ1 shown in FIG. 6, when the helicoid ring 18 rotates in the retracting direction, the rotating operation of the helicoid ring 18 at a fixed position in the optical axis direction ends, and subsequently the helicoid ring 18 starts moving rearward in the optical axis direction while rotating. Thereupon, the spur gear 18c of the helicoid ring 18 is disengaged from the gear portion 64a of the interconnecting gear 64, which in turn faces the flat portion 64b2 of the rotation restricting portion 64b. Since each of the spur gear 18c and the gear portion 64a has a predetermined length in the optical axis direction, the engagement between the spur gear 18c and the gear portion 64a is not released at once immediately after the fixed-position rotating state of the helicoid ring 18 changes to the rotating and retracting state thereof at the angular position θ1, but is released at an angular position θ3 at which the helicoid ring 18 further retracts in the retracting direction by a small amount of movement. Due to this disengagement of the spur gear 18c from the gear portion 64a, the rotational force of the helicoid ring 18 is no longer transferred to the interconnecting gear 64, so that the upward rotational motion of the retracting lever 60 is terminated. FIGS. 15 and 22 show the retracting lever 60 in a state in which the upward rotational motion thereof has been terminated. As can be seen in FIG. 22, the force-applying end 60d of the retracting lever 60 is in contact with the arc-shaped surface 66a after passing the boundary between the arc-shaped surface 66a and the leading surface 66b. In this state, the vertical moving frame 36 lifted by the retracting lever 60 have been moved into the retraction space SP in the housing 11 as shown in FIG. 1.

The retracting operation of the zoom lens 10 is not completed at the angular position θ3 where the upward retracting motion of the vertical moving frame 36 is completed; the helicoid ring 18 and the cam ring 26 further move rearward in the optical axis direction while rotating. Thereafter, when the helicoid ring 18 and the cam ring 26 reach their respective retracted positions shown in FIG. 1, the cylindrical portion 25b of the second lens group support frame 25 that holds the second lens group 13d is retracted into the space in the housing 11 which is formerly occupied by the vertical moving frame 36 when the zoom lens 10 is in a photographic state. In this manner, the thickness of the photographing optical system in the optical axis direction can be reduced in the retracted state of the zoom lens 10, which makes it possible to reduce the thickness of the zoom lens 10, which in turn makes it possible to reduce the thickness of a camera incorporating the zoom lens 10.

In the above-described retracting operation of the zoom lens 10, after the zoom lens 10 retracts to the angular position θ3 where the engagement between the gear portion 64a of the interconnecting gear 64 and the spur gear 18c of the helicoid ring 18 is released, the spur gear 18c faces the flat portion 64b2 of the rotation restricting portion 64b. In this state where the spur gear 18c faces the flat portion 64b2, the flat portion 64b2 is positioned in close vicinity of the tooth top (outermost periphery/addendum circle) of the spur gear 18c. Therefore, even if the interconnecting gear 64 tries to rotate, the flat portion 64b2 abuts against the outer periphery of the spur gear 18c to prevent the interconnecting gear 64 from rotating (see FIGS. 10 and 13). In this manner, the interconnecting gear 64 is prevented from rotating accidentally in the retracted state of the zoom lens 10, and thus the retracting lever 60 can be securely locked in the upper rotational position. In other words, in the retracted state shown in FIG. 22, although the retracting lever 60 is biased counterclockwise as viewed in FIG. 22 by the torsion spring 60c, the retracting lever 60 is prevented from rotating counterclockwise by a gear train consisting of the coaxial gear 61, the pair of relay gears 62 and 63 and the interconnecting gear 64. The abutting physical relationship between the flat portion 64b2 of the interconnecting gear 64 and the spur gear 18c serves as a rotation restricting device for restricting rotation of the retracting lever 60. Therefore, the retracting lever 60 can be securely held in a halting state without any complicated locking mechanism.

In a state in which the vertical moving frame 36 is radially retracted upward completely out of the linear retracting path of the first and second lens groups 13a and 13d, the force-applying end 60d of the retracting lever 60 abuts against the arc-shaped surface 66a which has an arc-shaped surface having its center on the axis of the pivot shaft 60a of the retracting lever 60. Therefore, even if the angle of the retracting lever 60 is changed, the vertical position of the vertical moving frame 36 is not changed and held constant so long as the force-applying end 60d abuts against the arc-shaped surface 66a.

The operation of the retracting mechanism from the wide-angle extremity to the retracted position has been described above. On the other hand, in the zooming range from the wide-angle extremity to the telephoto extremity, the spur gear 18c of the helicoid ring 18 rotating at a fixed position remains engaged with the gear portion 64a of the interconnecting gear 64, and thus the interconnecting gear 64 is rotated according to the rotation of the helicoid ring 18. However, rotating the helicoid ring 18 from the wide-angle extremity state shown in FIG. 23 toward the telephoto extremity causes the coaxial gear 61 to rotate counterclockwise as viewed in FIG. 23, i.e., in a direction to move the rotation transfer protrusion 61a away from the rotation transfer protrusion 60b. Therefore, in the zooming range from the wide-angle extremity to the telephoto extremity, no rotational force is transferred to the retracting lever 60, and the retracting lever 60 is held at the angular position shown in FIG. 23. In this manner, the range of rotation of the retracting lever 60 can be minimized, thereby preventing an increase in size of the zoom lens barrel.

Figure 24:
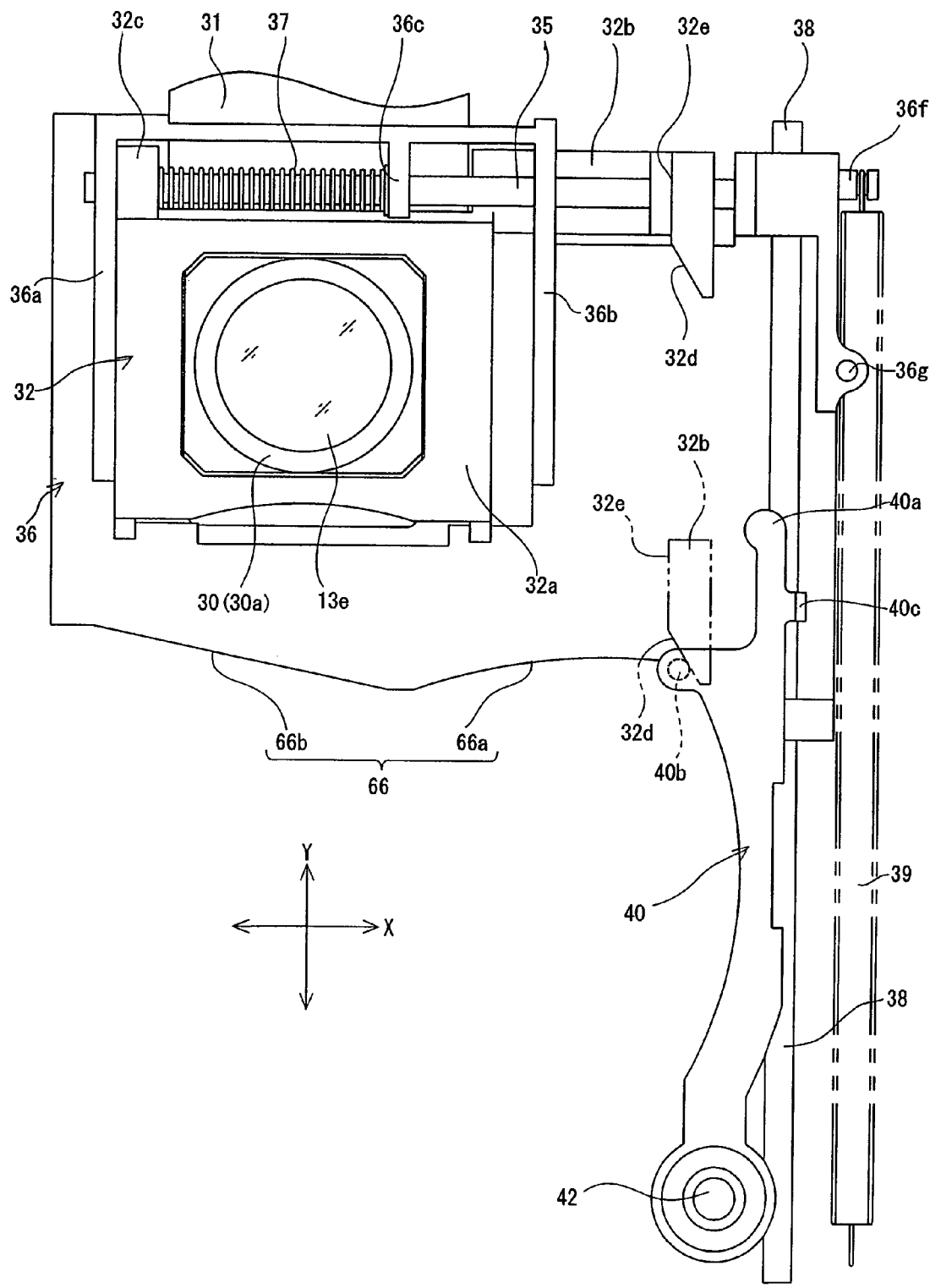
FIG. 24 is a front elevational view of elements shown in FIG. 8 for illustrating the relationship between the horizontal driving lever and the vertical motion of the CCD holder, the horizontal moving frame, and the vertical moving frame.
Figure 25:
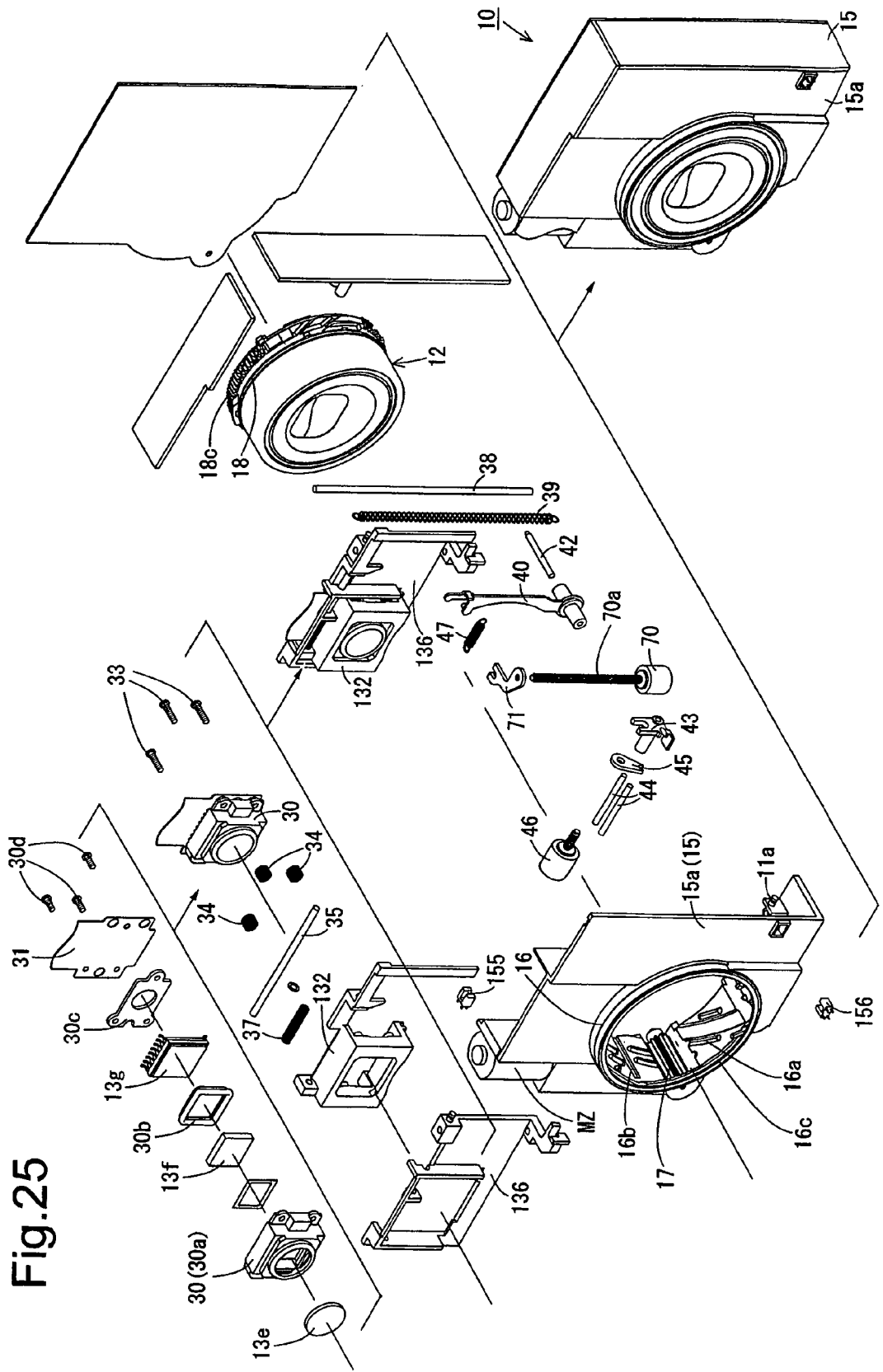
FIG. 25 is an exploded perspective view of a second embodiment of the zoom lens to which the present invention is applied.

When the vertical moving frame 36 is retracted upward to the off-optical-axis retracted position Z2 as shown in FIG. 24, the position restricting surface 32e that is provided on the arm portion 32b of the horizontal moving frame 32 is disengaged from the operation pin 40b that is provided on the horizontal driving lever 40. This disengagement of the position restricting surface 32e from the operation pin 40b causes the horizontal moving frame 32 to move leftward as viewed in FIG. 24 by the biasing force of the horizontal moving frame biasing spring 37 up to a point at which the frame portion 32a of the horizontal moving frame 32 abuts against the motion restricting frame 36a of the vertical moving frame 36. From this state, upon the vertical moving frame 36 being moved down to the photographing optical axis Z1, the inclined surface 32d of the horizontal moving frame 32 comes in contact with the operation pin 40b as shown by two-dot chain lines in FIG. 24. The inclined surface 32d is inclined so as to guide the operation pin 40b to the position restricting surface 32e side according to the downward motion of the vertical moving frame 36. Therefore, upon the vertical moving frame 36 being moved down to the photographing position, the operation pin 40b is again engaged with the position restricting surface 32e as shown in FIG. 20 and the frame portion 32a of the horizontal moving frame 32 returns to the neutral position thereof between the motion restricting frame 36a and the motion restricting frame 36b.

FIGS. 25 through 32 show a second embodiment of the zoom lens 10. Although the first embodiment of the zoom lens 10 is provided with the vertical driving lever 41 and the second stepping motor 53 as a driving device for driving the vertical moving frame 36, and is provided with the retracting lever 60 as another driving device for retraction, the second embodiment of the zoom lens 10 is provided with a second stepping motor (an element of the radially-retracting device/ an element of the image stabilizer) 70 which is also used to serve as these driving devices. Therefore, the second embodiment of the zoom lens 10 is not provided with elements corresponding to the vertical driving lever 41, the second moving member 50, the pair of guide bars 51, the driven nut member 52, the second stepping motor 53 and the extension coil spring 54 (see FIG. 29). In FIGS. 25 through 32, elements and portions which are similar to those in the first embodiment of the zoom lens are designated with the same reference numerals, and the detailed description of such elements are omitted in the following description.

Figure 26:
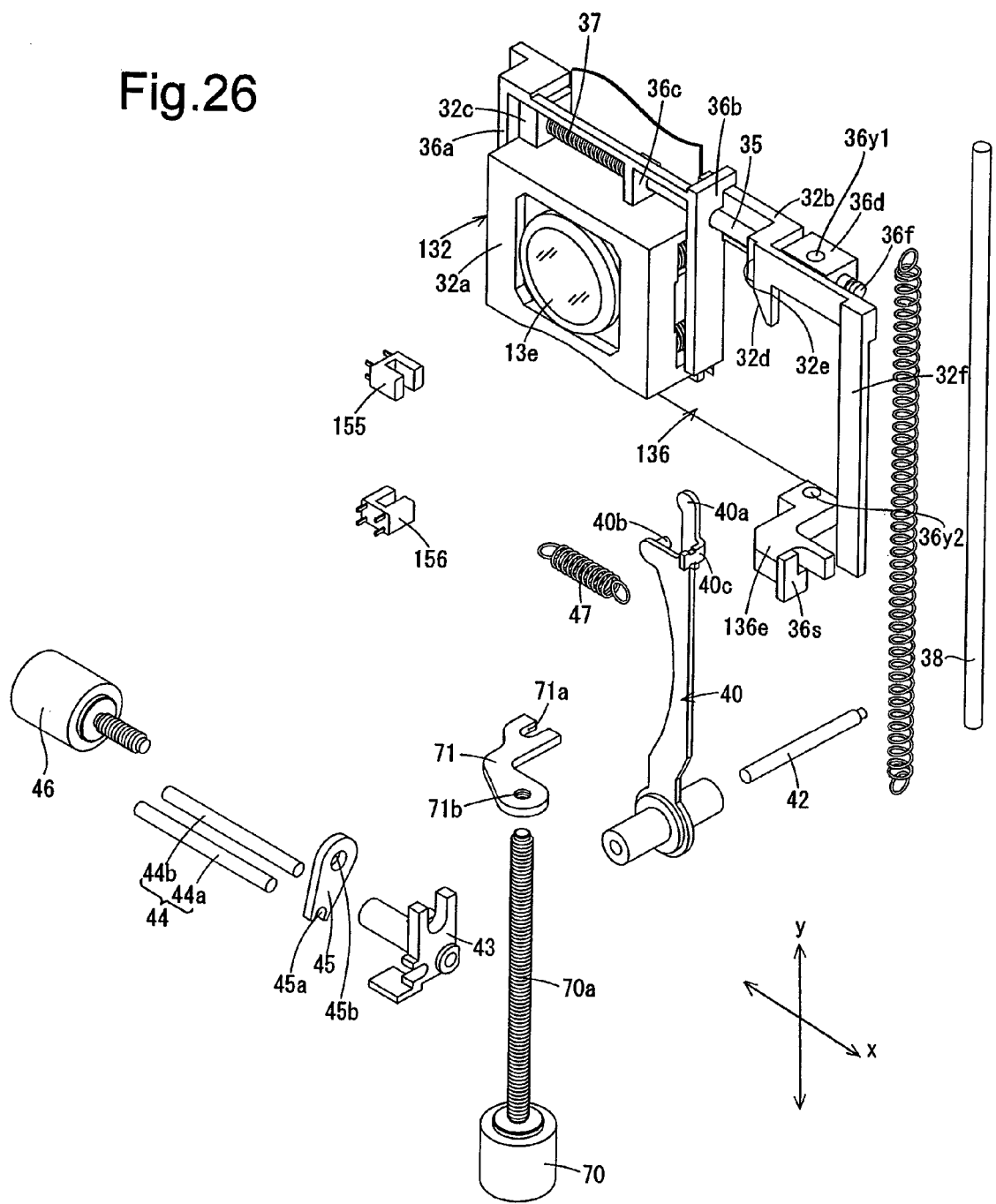
FIG. 26 is an exploded perspective view of elements of the image stabilizing mechanism and the radially-retracting mechanism in the second embodiment of the zoom lens.

As shown in FIGS. 27, 28, 30 and 31, the second stepping motor 70 is installed in the vicinity of the vertical guide shaft 38, and is provided with a drive shaft (feed screw) 70a which extends parallel to the vertical guide shaft 38. A driven nut member (an element of the radially-retracting device/an element of the image stabilizer) 71 is screw-engaged with the drive shaft 70a. Specifically, as shown in FIG. 26, the driven nut member 71 is provided with a rotation restricting groove 71a which is slidably fitted on the vertical guide shaft 38, and a female screw hole 71b which is screw-engaged with the drive shaft 70a. Rotating the drive shaft 70a forward and reverse by driving the second stepping motor 70 causes the driven nut member 71 to move upwards and downwards in the y-axis direction along the vertical guide shaft 38. As shown in FIGS. 27, 28, 30 and 31, the driven nut member 71 is in contact with a vertical moving frame (an element of the radially-retracting device/an element of the image stabilizer) 136 (which corresponds to the vertical moving frame 36 in the first embodiment of the zoom lens) from bottom thereof. Due to this structure, driving the second stepping motor 70 causes the driven nut member 71 to move along the vertical guide shaft 38, thus causing the vertical moving frame 136 to move along the vertical guide shaft 38. Specifically, moving the driven nut member 71 upward causes the driven nut member 71 to push a lower bearing portion 136e of the vertical moving frame 136 upward, so that the vertical moving frame 136 moves upward against the biasing force of the vertical moving frame biasing spring 39. Conversely, moving the driven nut member 71 downward causes the vertical moving frame 136 to move downward together with the driven nut member 71 by the biasing force of the vertical moving frame biasing spring 39.

Figure 27:
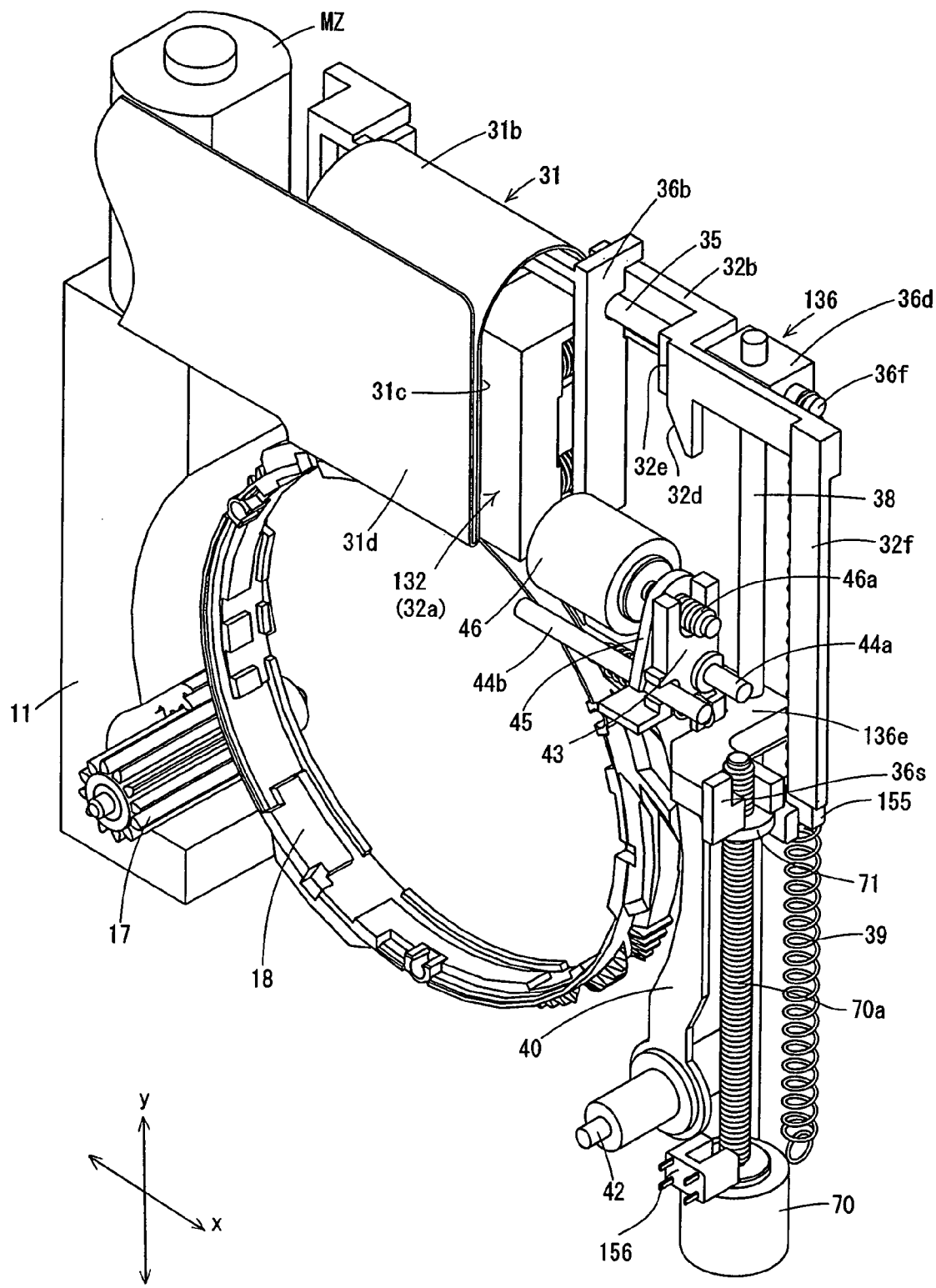
FIG. 27 is a front perspective view of the image stabilizing mechanism and the radially-retracting mechanism in the second embodiment of the zoom lens, illustrating the retracted state of a CCD holder in the radially retracted state of the zoom lens.
Figure 28:
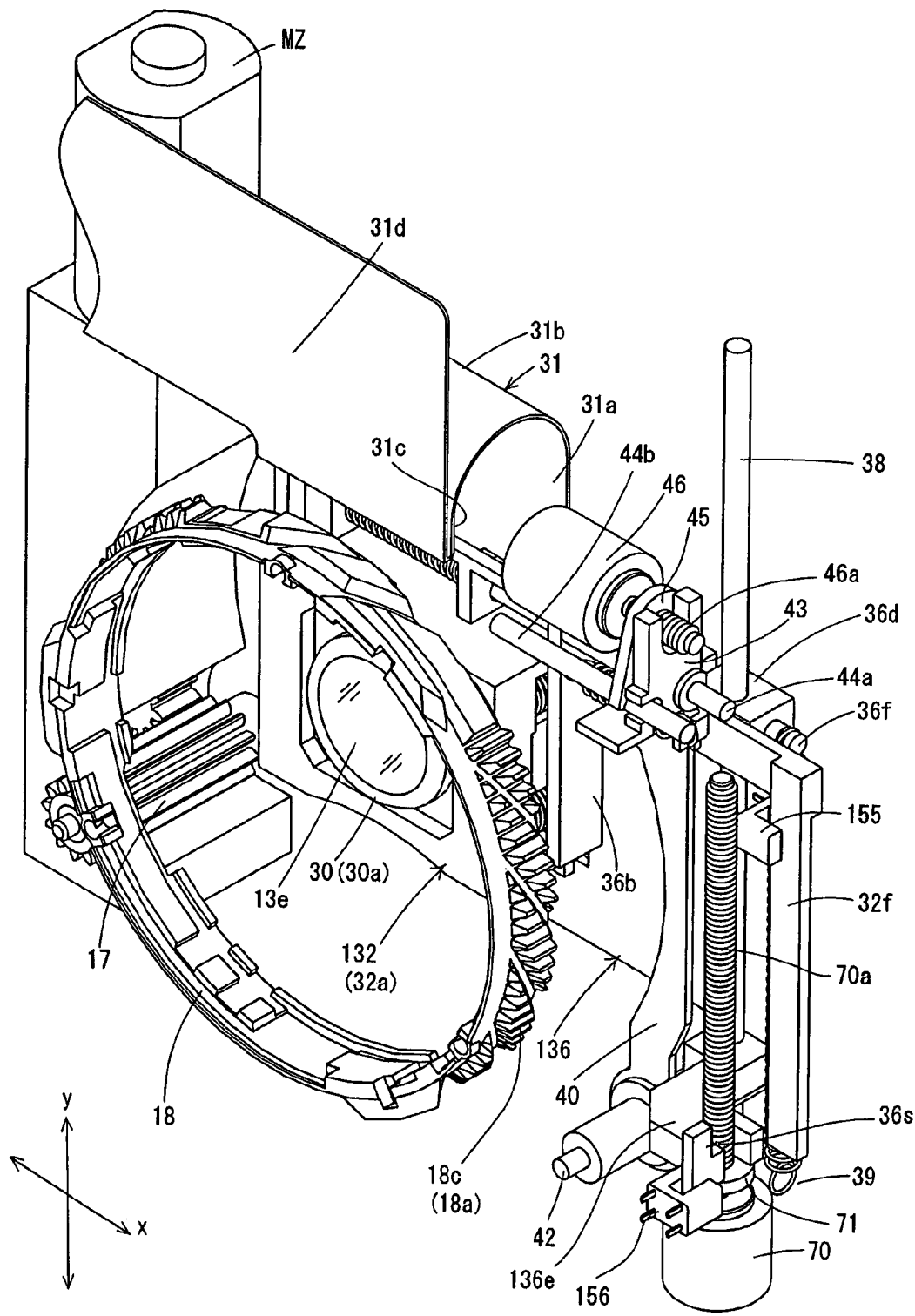
FIG. 28 is a front perspective view of the image stabilizing mechanism and the radially-retracting mechanism in the second embodiment of the zoom lens, illustrating the optical-axis advanced state of the CCD holder in a photographic state of the zoom lens.
Figure 29:
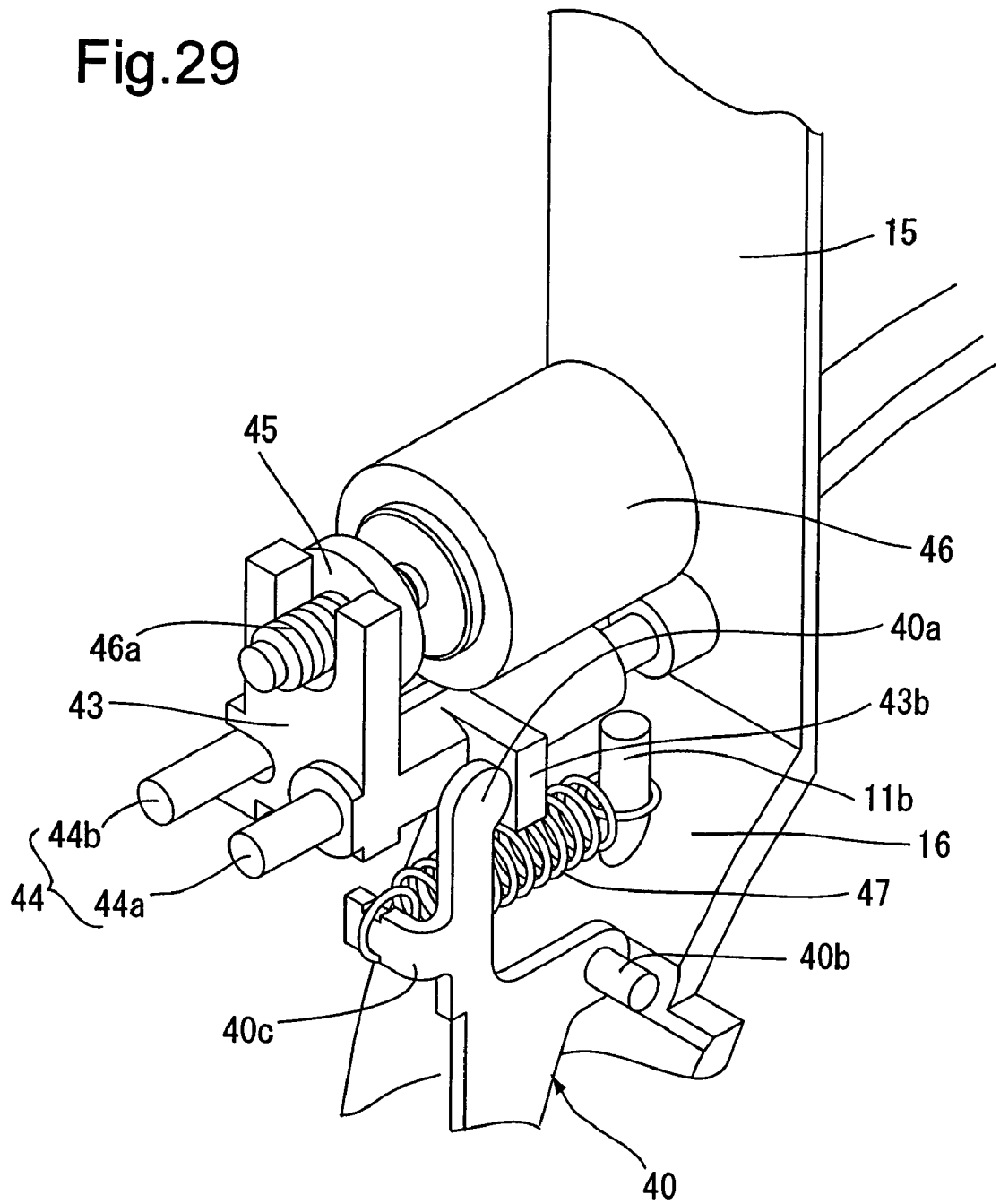
FIG. 29 is a rear perspective view of a portion of an x-direction image stabilizing mechanism as viewed from the rear side of FIGS. 27 and 28.
Figure 30:
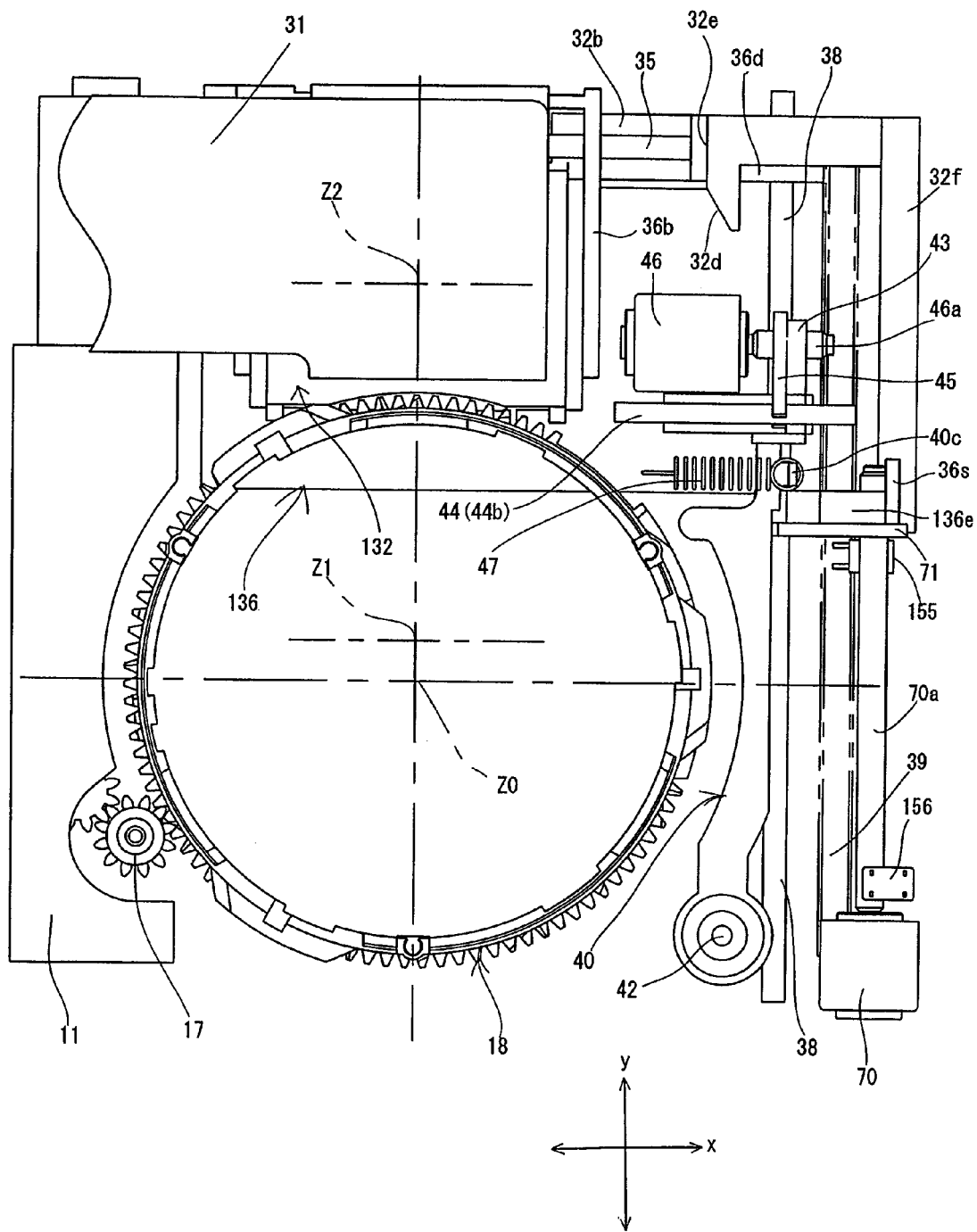
FIG. 30 is a front elevational view of the image stabilizing mechanism and the radially-retracting mechanism in the state shown in FIG. 27, as viewed from the front in the optical axis direction.
Figure 31:
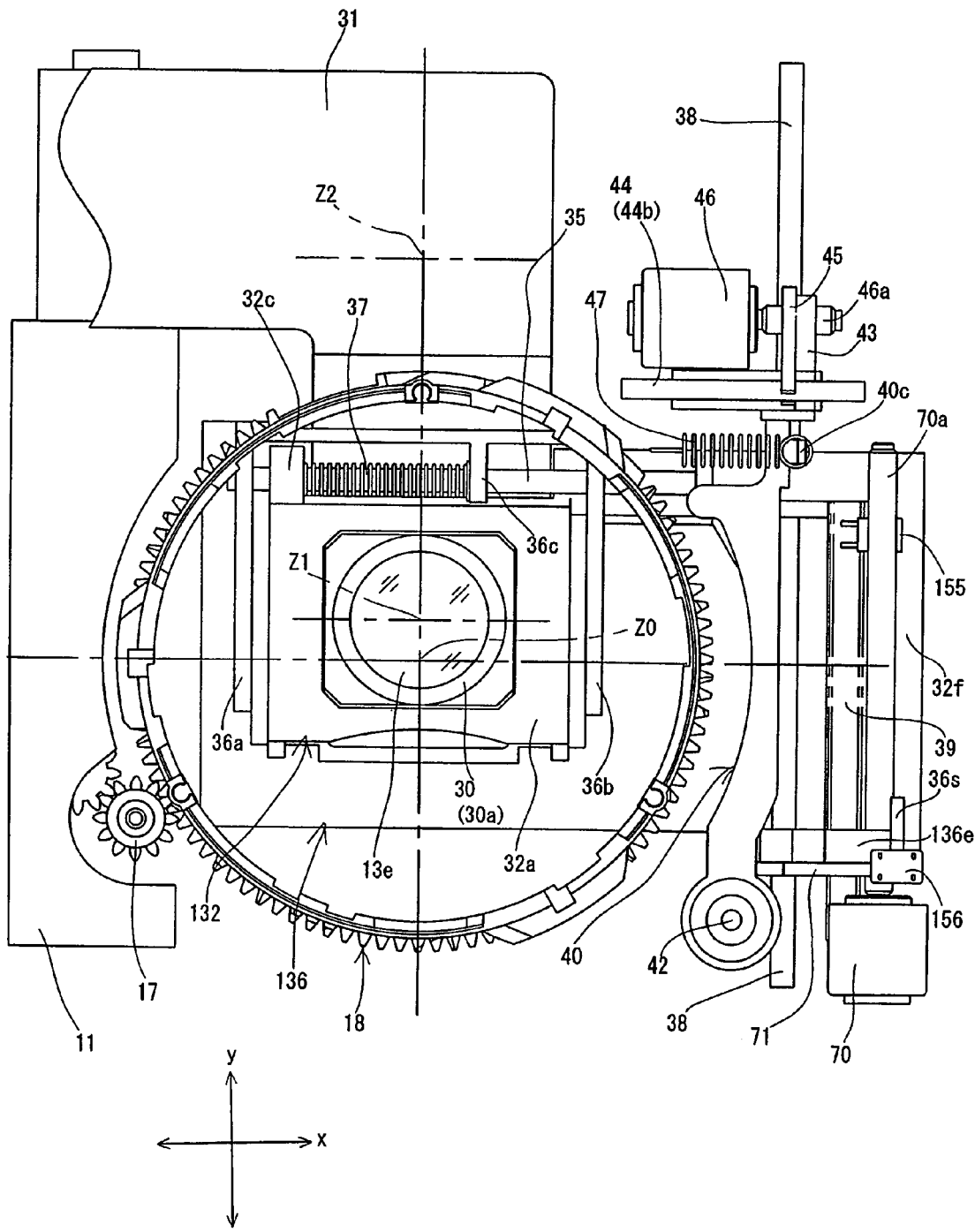
FIG. 31 is a front elevational view of the image stabilizing mechanism and the radially-retracting mechanism in the state shown in FIG. 28, as viewed from the front in the optical axis direction.
Figure 32:
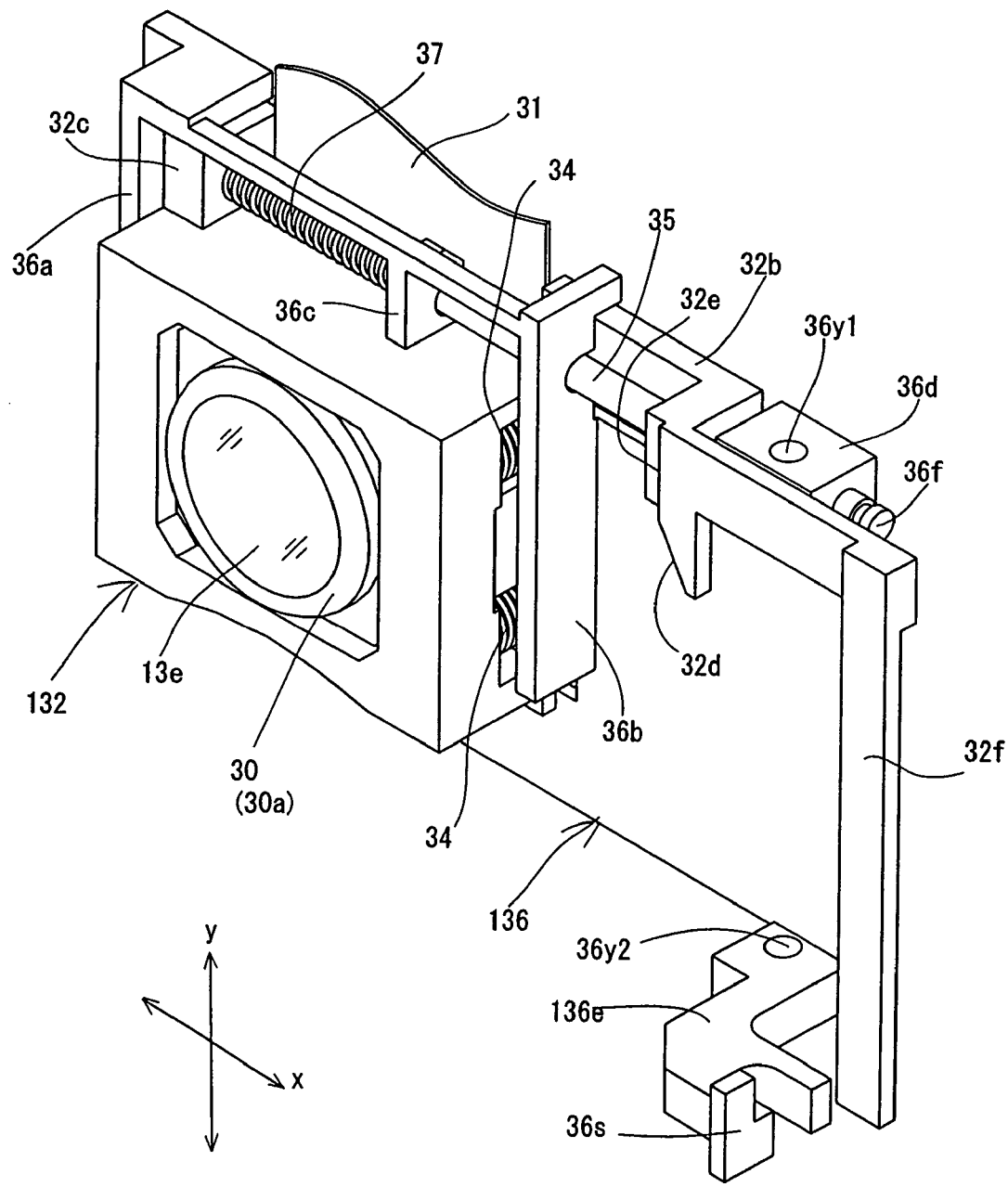
FIG. 32 is a front perspective view of a horizontal moving frame and a vertical moving frame which support the CCD holder, and associated elements in the second embodiment of the zoom lens.

The CCD holder 30 is supported by a horizontal moving frame 132 which corresponds to the horizontal moving frame 32 of the first embodiment of the zoom lens. The horizontal moving frame 132 is provided with a plate portion 32f which is formed as a part of the arm portion 32b to extend downward from the arm portion 32b. The plate portion 32f has a substantially inverted-L shape as viewed from the front of the camera, and is elongated in the y-axis direction so that the lower end of the plate portion 32f reaches down to the close vicinity of the lower bearing portion 136e. Additionally, the vertical moving frame 136 is provided at the end of the lower bearing portion 136e with a plate portion 36s. As shown in FIGS. 27 and 28, two photo sensors 155 and 156, each having a light emitter and a light receiver which are spaced apart from each other are installed in the housing 11. The initial position of the horizontal moving frame 132 can be detected by the photo sensor 155 when the plate portion 32f passes between the light emitter and the light receiver of the photo sensor 155.

The plate portion 32f and the photo sensor 155 constitute a photo interrupter. Likewise, the initial position of the vertical moving frame 136 can be detected by the photo sensor 156 when the plate portion 36s passes between the light emitter and the light receiver of the photo sensor 156. The plate portion 36s and the photo sensor 156 constitute a photo interrupter.

The second stepping motor 70 moves the vertical moving frame 136 in the y-axis direction within a predetermined range of movement (the range of movement for counteracting camera shake) in which the third lens group 13e, the low-pass filter 13f and the CCD 13g do not deviate from the photographing optical axis Z1 in a photographic state of the zoom lens 10 between the wide-angle extremity and the telephoto extremity. In this photographic state, the driven nut member 71 is located in the vicinity of the lower end of the drive shaft 70a (see FIGS. 28 and 31). Thereafter, when the zoom lens 10 is retracted upon the main switch 14d being turned off, the second stepping motor 70 moves the driven nut member 71 upward to the close vicinity of the upper end of the drive shaft 70a to retract the vertical moving frame 136 to the off-optical-axis retracted position Z2 (see FIGS. 27 and 30). The drive shaft 70a is made to serve as a feed screw extending parallel to the vertical guide shaft 38 to be capable of moving the vertical moving frame 136 from the photographing optical axis Z1 to the off-optical-axis retracted position (radially retracted position) Z2. The drive shaft 70a has an axial length longer than the distance between the photographing optical axis Z1 and the off-optical-axis retracted position Z2 in the y-axis direction.

The amount of retracting movement of the vertical moving frame 136 in the y-axis direction can be determined by counting the driving pulses of the second stepping motor 70 from the initial position of the vertical moving frame 136 that is detected by the photo interrupter that consists of the plate portion 36s and the photo sensor 156. The second stepping motor 70 is stopped upon the number of driving pulses of the second stepping motor 70 reaching a predetermined number of pulses. In this manner, the vertical moving frame 136 is radially retracted into the retraction space SP (see FIGS. 1 and 2) in the housing 11. The timing of the commencement of the radially retracting operation of the vertical moving frame 136 and the timing of the termination thereof can be freely set. For instance, similar to the first embodiment of the zoom lens, the operation of the second stepping motor 70 can be controlled so that the retracting operation of the zoom lens 10 starts at the angular position θ2 and is completed at the angular position θ3.

In each of the above described first and second embodiments of the zoom lenses, image stabilization can be carried out by moving a portion of the photographing optical system of the zoom lens 10 which includes the third lens group 13e, the low-pass filter 13f and the CCD 13g in the x-axis direction and the y-axis direction as appropriate, in a plane perpendicular to the photographing optical axis Z1. In addition, when the zoom lens 10 changes from a photographic state to a non-photographing state (the retracted state), the vertical moving frame 36 is lifted along the y-axis direction by a rotation of the retracting lever 60, which causes a unit consisting of the third lens group 13e, the low-pass filter 13f and the CCD 13g to retract from a position on the photographing optical axis Z1 to the off-optical-axis retracted position Z2. In the second embodiment of the zoom lens, a similar retracting action of the unit consisting of the third lens group 13e, the low-pass filter 13f and the CCD 13g along the y-axis direction can be achieved by driving the vertical moving frame 36 by the second stepping motor 70.

The image transmission flexible PWB 31, which is connected to the CCD 13g that is moved in the above described manner, is resiliently deformable. As described above, the image transmission flexible PWB 31 includes a free-deformable portion which consists of the first linear portion 31a and the second linear portion 31c, each of which is flat and parallel to the y-axis direction, and the U-shaped portion 31b which is connected between the first linear portion 31a and the second linear portion 31c. This free-deformable portion has an inverted U-shape extending to the inside of the retraction space SP in the housing 11. When the retractable optical unit that consists of the third lens group 13e, the low-pass filter 13f and the CCD 13g, is accommodated in the retraction space SP, the U-shaped portion 31b is positioned so as to arch over the top of the retractable optical unit as shown in FIGS. 1 and 10, and the second linear portion 31c that extends downward from the front end of the U-shaped portion 31b is positioned in front of the retractable optical unit to face the front thereof. Since the first linear portion 31a is fixed to the back of the retractable optical unit behind the second linear portion 31c, the free-deformable portion of the image transmission flexible PWB 31 forms a shape so as to accommodate and cover the retractable optical unit including the CCD 13g. In this state, first linear portion 31a overlaps the second linear portion 31c, which are respectively located on the opposite sides of the retractable optical unit in the forward/rearward direction (horizontal direction as viewed in FIG. 1) of the zoom lens 10, by a maximum amount in the forward/rearward direction of the zoom lens 10. In other words, the length (height) of the area in the y-axis direction which is occupied by the free-deformable portion of the image transmission flexible PWB 31 is reduced to a minimum. In addition, the distance from the photographing optical axis Z1 to the U-shaped portion 31b in the y-axis direction is at a maximum. Therefore, in the retracted state of the zoom lens 10 shown in FIG. 1, the image transmission flexible PWB 31 is accommodated in the retraction space SP in the housing 11 along an inner surface thereof with high efficiency in space utilization, which prevents the image transmission flexible PWB 31 from interfering with the retractable optical unit and other movable elements.

When the retractable optical element that includes the CCD 13g moves downward in the y-axis direction toward the photographing position (shown in FIGS. 2 and 11) from the radially retracted position (shown in FIGS. 1 and 10), the first linear portion 31a that is connected to the CCD 13g is drawn downward. Thereupon, the lengths of the first linear portion 31a and the second linear portion 31c relatively vary to increase and decrease in the y-axis direction, respectively, while the U-shaped portion 31b is brought toward the photographing optical axis Z1 because the third linear portion 31d of the image transmission flexible PWB 31 is fixed to the housing 11. This relative variation in length of the first linear portion 31a and the second linear portion 31c reduces the amount of overlap between the first linear portion 31a and the second linear portion 31c in the forward/rearward direction of the zoom lens 10, thus increasing the length (height) of the area in the y-axis direction which is occupied by the free-deformable portion of the image transmission flexible PWB 31. Consequently, the degree of flexibility in the first linear portion 31a is increased with less operating resistance to the retractable optical unit (which includes the CCD 13g) during movement thereof. Reducing the operating resistance of the image transmission flexible PWB 31 to the retractable optical unit in such a manner makes it possible to reduce the physical load on each of the first stepping motor 46 and the second stepping motor 53 or 70 that serve as drive sources for image stabilization, especially in a photographic state of the zoom lens 10, because the retractable optical unit that includes the CCD 13g is driven not only in the y-axis direction but also in the x-axis direction to counteract image shake in a photographic state of the zoom lens 10. Moreover, such reduction of loads on each stepping motor makes it possible to improve the positional accuracy of the retractable optical unit. Since the U-shaped portion 31b holds its shape extending to the inside of the retraction space SP even in a photographic state of the zoom lens as shown in FIGS. 2 and 11, the free-deformable portion of the image transmission flexible PWB 31 does not sag toward the photographing optical axis to intercept a bundle of object light traveling in an optical path of the photographing optical system.

As can be understood from the above description, in the above described embodiment of the zoom lens 10, the free-deformable portion of the image transmission flexible PWB 31 takes on a shape accommodating and covering the retractable optical unit with high efficiency in space utilization when the retractable optical unit that includes the CCD 13g is retracted to the radially retracted position off the photographing axis Z1, and also the free-deformable portion of the image transmission flexible PWB 31 is extended in the y-axis direction to form a shape so as to uncover the electronic component, to thereby increase the degree of flexibility in the image transmission flexible PWB 31 when the retractable optical unit is positioned in the photographing position on the photographing axis Z1. This structure makes it possible to install the image transmission flexible PWB 31 while maintaining compatibility between the efficiency in space utilization in accommodating the image transmission flexible PWB 31 and the reduction in the operating resistance of the image transmission flexible PWB 31 to the retractable electronic component.

Although the present invention has been described based on the above illustrated first and second embodiments, the present invention is not limited solely to these particular embodiments. For instance, although the above described embodiment is applied to a zoom lens, the present invention can be applied to an imaging device other than zoom lens as long as the imaging device is of a type in which an electronic component serving as a part of an a photographing optical system is moved between a photographing position on the optical axis of the photographing optical system and a retracted position away from the same optical axis.

Although an image sensor such as the CCD 13g of the above described embodiment of the zoom lens is suitable for the electronic component connected to the flexible PWB in the present invention, another type of electronic component such as a shutter or a diaphragm can be adopted as the electronic component connected to the flexible PWB. In this case, the wiring structure of the flexible PWB can be modified in accordance with the type of electronic component connected to the flexible PWB within the spirit and scope of the invention claimed. For instance, in the case of adopting an image sensor as the electronic component connected to the flexible PWB, the front side of the image sensor includes an imaging surface, and accordingly, an optimum wiring structure for the flexible PWB can be achieved by having a portion of the flexible PWB fixedly connected to the back side of the image sensor (the CCD 13g) and so that the free deformable portion of the flexible PWB is brought to extend toward a fixed portion (the third linear portion 31d) thereof in front of the image sensor. On the other hand, the point of connection of the flexible PWB to a shutter or a diaphragm is not limited to the extent of that of an image sensor, so long the flexible PWB does not intercept an object light-bundle during a photographing operation. Therefore, in the case of applying the present invention to an electronic component other than an image sensor, a connecting portion of the flexible PWB which corresponds to the first linear portion 31a can be connected to a front surface or a side surface of the electronic component while a fixed portion of the flexible PWB which corresponds to the third linear portion 31d can be positioned behind the radially retracted position of the electronic component or on another side thereof.

Although the retractable optical unit that includes the CCD 13g is moved in the x-axis direction and the y-axis direction in a plane orthogonal to the photographing optical axis Z1 to counteract image shake in a photographic state in the above illustrated embodiment of the zoom lens, the motion of the electronic component to which a flexible PWB is connected in a photographic state is not limited solely to such particular motion. For instance, the present invention is effective even in the case when applied to a type of imaging device in which the electronic component, to which a flexible PWB is connected, moves along an optical axis of a photographing optical system.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An imaging device comprising:

an image sensor on which an object image is formed via a photographing optical system;

a radially-retracting device which moves said image sensor between a photographing position, at which said image sensor is located on a common optical axis of said photographing optical system in a photographic state, and a radially-retracted position, at which said image sensor is radially retracted away from said common optical axis in a non-photograph state; and a flexible PWB for electrically connecting said image sensor to an image processing circuit, wherein said flexible PWB includes:

a fixed portion positioned in front of said image sensor when said image sensor is at said radially-retracted position of said image sensor; and a free-deformable portion extending from said image sensor toward said fixed portion, wherein said free-deformable portion forms a shape so as to accommodate and cover said image sensor when said image sensor is radially retracted to said radially-retracted position, whereby a portion of said flexible PWB is located between said image sensor and the fixed portion, and wherein said free-deformable portion is extended to form a shape so as to uncover said image sensor when said image sensor is positioned in said photographing position, whereby no portion of said flexible PWB is located in front of said image sensor.

2. The imaging device according to claim 1, wherein said free-deformable portion comprises:

a first flat portion which is fixed at one end thereof to the back of said image sensor and extends toward said radially-retracted position of said image sensor;

a U-shaped portion which is bent over forward from said first flat portion; and a second flat portion which extends from said U-shaped portion toward said photographing position of said image sensor and is substantially parallel to said first flat portion, wherein said second flat portion is positioned in front of said image sensor to face said image sensor when said image sensor is in said radially-retracted position, and wherein, when said image sensor is moved from said radially retracted position to said photographing position, lengths of said first flat portion and said second flat portion relatively vary to increase and decrease, respectively, while said U-shaped portion is moved toward said photographing position.

3. The imaging device according to claim 1, wherein said image sensor is moved linearly in a direction perpendicular to said common optical axis between said photographing position and said radially-retracted position by said radially-retracting device.

4. The imaging device according to claim 1, further comprising:
- an image-shake detection sensor for detecting a magnitude and a direction of vibration applied to said photographing optical system; and
- an image stabilizer which moves said image sensor in a plane orthogonal to said common optical axis so as to counteract said vibration in accordance with an output of said image-shake detection sensor when said image sensor is in said photographing position.

5. The imaging device according to claim 1, further comprising a retractable optical unit including said image sensor and at least one optical element positioned in front of said image sensor, wherein said retractable optical unit is fixed to one end of said free-deformable portion.

6. The imaging device according to claim 1, further comprising a telescoping lens barrel consisting of concentrically-arranged movable barrels, wherein said image sensor is moved to said radially-retracted position so as to be positioned radially outside of said telescoping lens barrel when said telescoping lens barrel is fully retracted linearly.

7. The imaging device according to claim 1, further comprising a stationary housing which supports said photographing optical system, wherein said fixed portion of said flexible PWB is fixed to an inner surface of said stationary housing.

8. An imaging device comprising:
- an electronic component provided in a photographing optical system;
- a radially-retracting device which moves said electronic component between a photographing position, at which said electronic component is located on a common optical axis of said photographing optical system in a photographic state, and a radially-retracted position, at which said electronic component is radially retracted away from said common optical axis in a non-photograph state; and
- a flexible PWB connected to said electronic component, wherein said flexible PWB includes a fixed portion positioned adjacent to said radially-retracted position of said electronic component; and a free-deformable portion extending from said electronic component toward said fixed portion, wherein said free-deformable portion forms a shape so as to accommodate and cover said electronic component when said electronic component is retracted to said radially-retracted position, and wherein said free-deformable portion is extended to form a shape so as to uncover said electronic component when said electronic component is positioned in said photographing position.

\* \* \* \* \*